US011411104B2

(12) United States Patent
Nishiwaki et al.

(10) Patent No.: US 11,411,104 B2
(45) Date of Patent: Aug. 9, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Tatsuya Nishiwaki, Komatsu Ishikawa (JP); Tsuyoshi Kachi, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 42 days.

(21) Appl. No.: 17/021,063

(22) Filed: Sep. 15, 2020

(65) Prior Publication Data
US 2021/0288177 A1 Sep. 16, 2021

(30) Foreign Application Priority Data

Mar. 10, 2020 (JP) .............................. JP2020-041031
Sep. 9, 2020 (JP) .............................. JP2020-151573

(51) Int. Cl.
*H01L 29/78* (2006.01)
*H01L 29/10* (2006.01)
(Continued)

(52) U.S. Cl.
CPC ...... *H01L 29/7813* (2013.01); *H01L 23/5227* (2013.01); *H01L 27/0629* (2013.01);
(Continued)

(58) Field of Classification Search
CPC ............ H01L 29/7813; H01L 29/4236; H01L 29/407; H01L 23/5227; H01L 27/0629; H01L 29/7803
See application file for complete search history.

(56) References Cited

U.S. PATENT DOCUMENTS 8,482,061 B2   7/2013   Nishimura
2011/0303925 A1*  12/2011   Nishimura .......... H01L 29/7813
                                                              257/77
2019/0006495 A1   1/2019   Ogura et al.

FOREIGN PATENT DOCUMENTS

JP   2011-258834 A   12/2011
JP   2017-92466 A    5/2017
JP   2019-12813 A    1/2019

* cited by examiner

*Primary Examiner* — Joseph C. Nicely
(74) *Attorney, Agent, or Firm* — Allen & Overy LLP

(57) ABSTRACT

According to one embodiment, a semiconductor device includes a first electrode, a semiconductor layer, a first conductive part, a second conductive part, and a second electrode. The semiconductor layer includes a first semiconductor region, a second semiconductor region, and a third semiconductor region. The first semiconductor region is electrically connected to the first electrode. The second semiconductor region is provided on the first semiconductor region. The third semiconductor region is provided on the second semiconductor region. The first conductive part includes a buried electrode provided in the first semiconductor region with a first insulator interposed. The second conductive part includes a gate electrode provided on the buried electrode with a second insulator interposed. The first conductive part is electrically connected to the second conductive part. An electrical resistance of the first conductive part is greater than an electrical resistance of the second conductive part.

8 Claims, 33 Drawing Sheets

(51) Int. Cl.
*H01L 29/40* (2006.01)
*H01L 29/423* (2006.01)
*H01L 27/06* (2006.01)
*H01L 23/522* (2006.01)

(52) U.S. Cl.
CPC ........ *H01L 29/1095* (2013.01); *H01L 29/407* (2013.01); *H01L 29/4236* (2013.01); *H01L 29/7803* (2013.01); *H01L 29/7808* (2013.01)

SEMICONDUCTOR DEVICE

CROSS-REFERENCE TO RELATED APPLICATIONS

This application is based upon and claims the benefit of priority from Japanese Patent Application No. 2020-041031, filed on Mar. 10, 2020; and Japanese Patent Application No. 2020-151573, filed on Sep. 9, 2020; the entire contents of which are incorporated herein by reference.

FIELD

Embodiments described herein relate generally to a semiconductor device.

BACKGROUND

A semiconductor device such as a Metal Oxide Semiconductor Field Effect Transistor (MOSFET) or the like is used in applications such as power conversion, etc. It is desirable for the power loss of the semiconductor device to be small.

DETAILED DESCRIPTION

Figure 1:
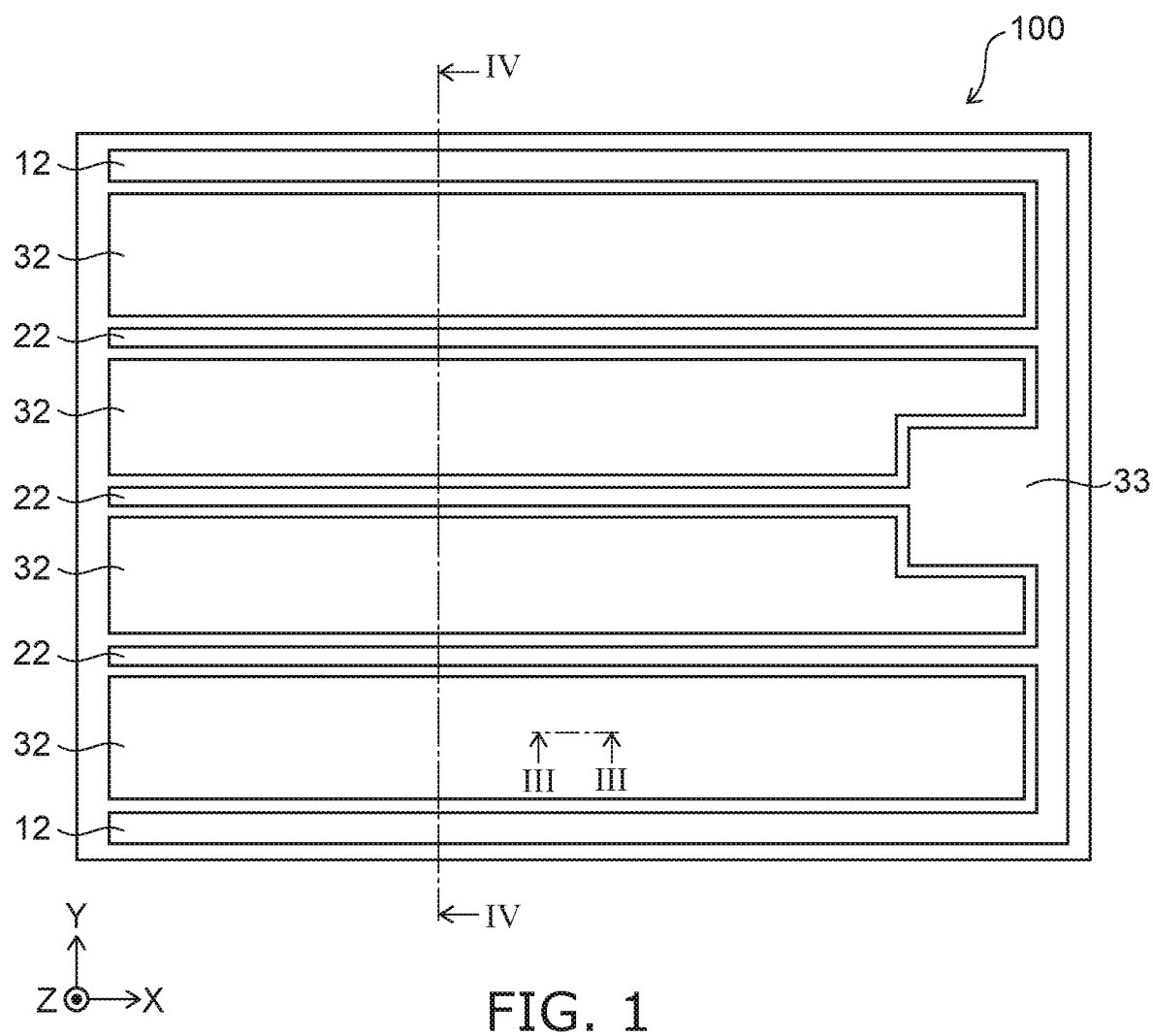
FIGS. 1 and 2 are plan views illustrating a semiconductor device according to a first embodiment.

According to one embodiment, a semiconductor device includes a first electrode, a semiconductor layer, a first conductive part, a second conductive part, and a second electrode. The semiconductor layer is provided on the first electrode. The semiconductor layer includes a first semiconductor region, a second semiconductor region, and a third semiconductor region. The first semiconductor region is electrically connected to the first electrode. The first semiconductor region is of a first conductivity type. The second semiconductor region is provided on the first semiconductor region. The second semiconductor region is of a second conductivity type. The third semiconductor region is provided on the second semiconductor region. The third semiconductor region is of the first conductivity type. The first conductive part includes a buried electrode provided in the first semiconductor region with a first insulator interposed. The second conductive part includes a gate electrode provided on the buried electrode with a second insulator interposed. The gate electrode faces the second semiconductor region via a gate insulator. The second electrode is provided on the semiconductor layer and electrically connected to the second and third semiconductor regions. The first conductive part is electrically connected to the second conductive part. An electrical resistance of the first conductive part is greater than an electrical resistance of the second conductive part.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

In the drawings and the description recited below, the notations of $n^+$, n, $n^-$, $p^+$, and p indicate relative levels of the impurity concentrations. In other words, a notation marked with "+" indicates that the impurity concentration is relatively greater than that of a notation not marked with either "+" or "−", and a notation marked with "−" indicates that the impurity concentration is relatively less than that of a notation without any mark. When both a p-type impurity and an n-type impurity are included in each region, these notations indicate relative levels of the net impurity concentrations after the impurities are compensated.

In the embodiments described below, each embodiment may be implemented by inverting the p-type and the n-type of each semiconductor region.

First Embodiment

Figure 2:
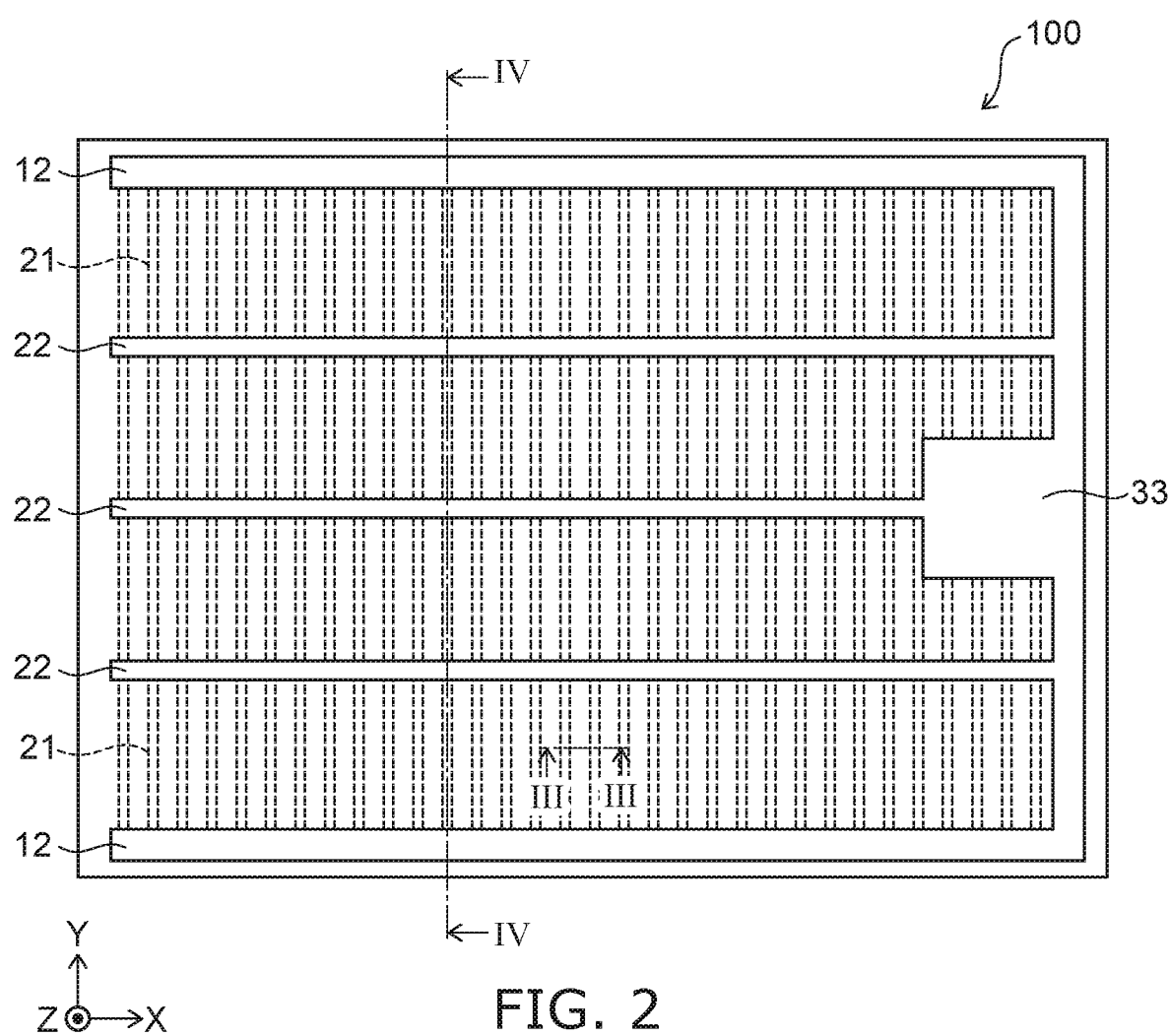
Figure 3:
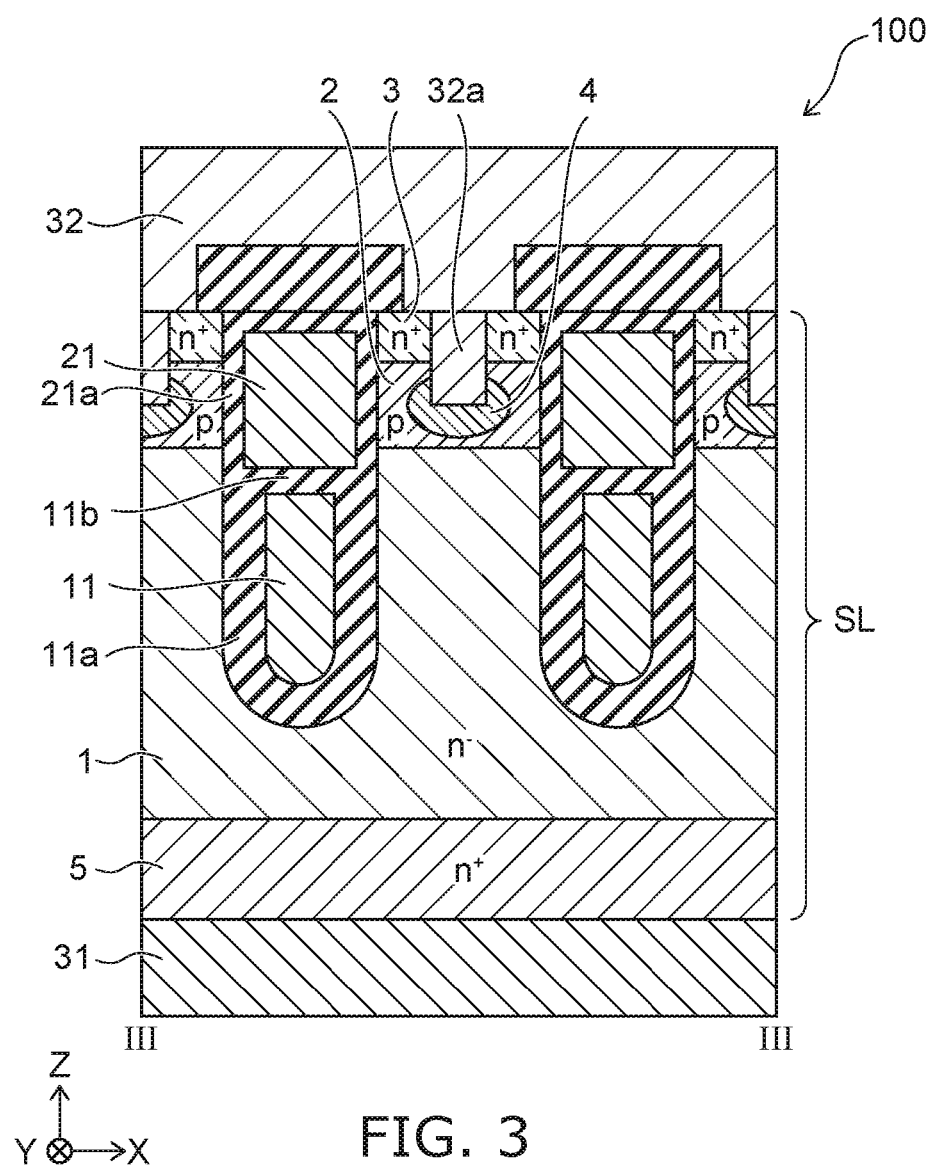
FIG. 3 is a III-III cross-sectional view of FIGS. 1 and 2.
Figure 4:
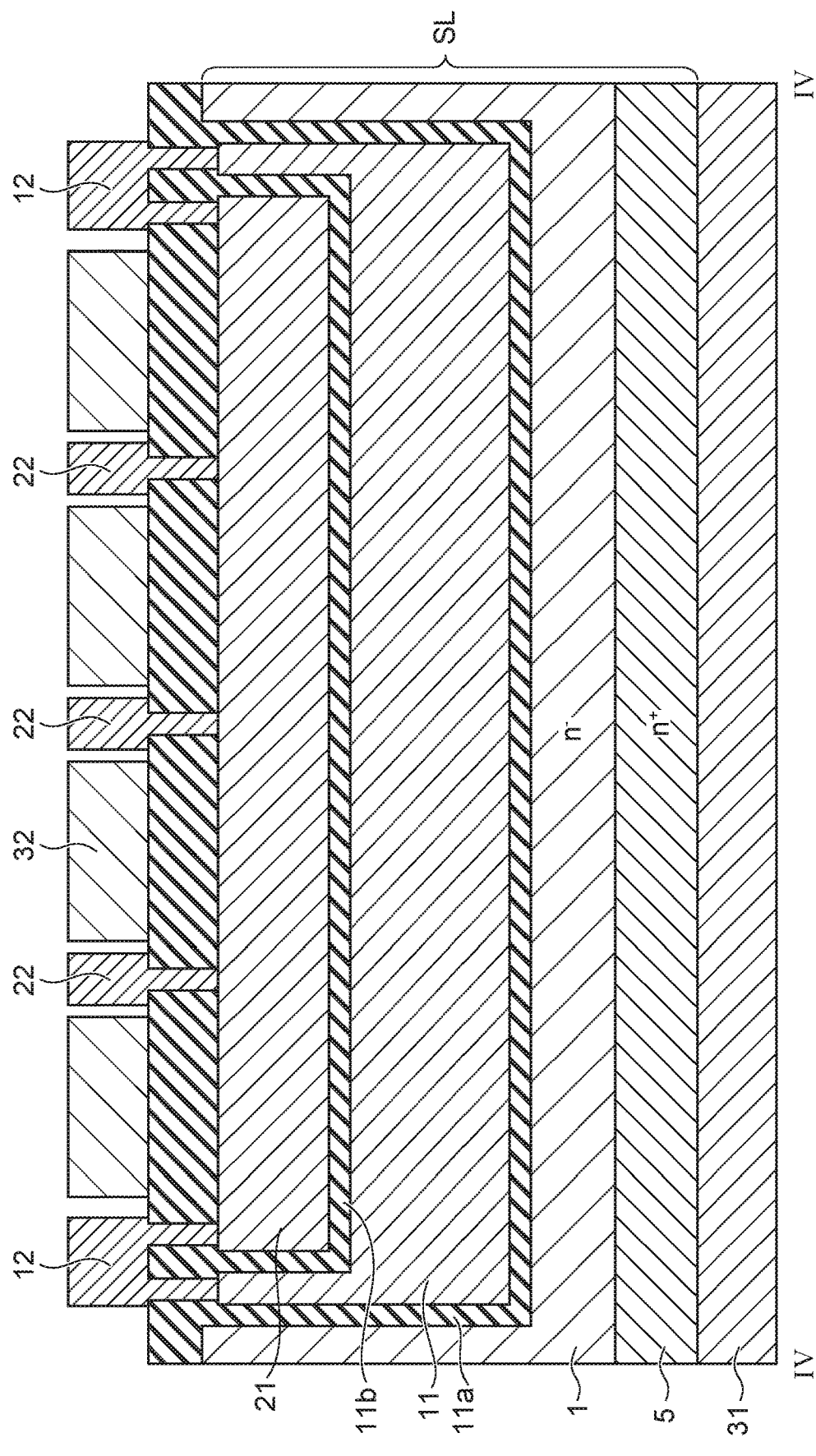
FIG. 4 is a IV-IV cross-sectional view of FIGS. 1 and 2.

FIGS. 1 and 2 are plan views illustrating a semiconductor device according to a first embodiment,
FIG. 3 is a III-III cross-sectional view of FIGS. 1 and 2.
FIG. 4 is a IV-IV cross-sectional view of FIGS. 1 and 2.

In FIG. 2, a source electrode 32 is not illustrated and a gate electrode portion 21 is illustrated by broken lines.

The semiconductor device according to the first embodiment is a MOSFET. As illustrated in FIGS. 1 to 4, the semiconductor device 100 according to the first embodiment includes a semiconductor layer SL, a first conductive part 10, a second conductive part 20, a drain electrode 31 (a first electrode), the source electrode 32 (a second electrode), and a gate pad 33 (a third electrode). The semiconductor layer SL includes an $n^-$-type (first-conductivity-type) drift region 1 (first semiconductor region), a p-type (second-conductivity-type) base region 2 (second semiconductor region), an $n^+$-type source region 3 (third semiconductor region), a $p^+$-type contact region 4, and an $n^+$-type drain region 5.

An XYZ orthogonal coordinate system is used in the description of the embodiments. The direction from the drain electrode 31 toward the $n^-$-type drift region 1 is taken as a Z-direction (a first direction). Two mutually-orthogonal directions perpendicular to the Z-direction are taken as an X-direction (a second direction) and a Y-direction (a third direction). In the description, the direction from the drain electrode 31 toward the $n^-$-type drift region 1 is called "up", and the reverse direction is called "down". These directions are based on the relative positional relationship between the drain electrode 31 and the $n^-$-type drift region 1 and are independent of the direction of gravity.

As illustrated in FIG. 1, the source electrode 32 and the gate pad 33 are provided at the upper surface of the semiconductor device 100. A first wiring portion 12 and a second wiring portion 22 are further provided in the example illustrated in FIG. 1. The first wiring portion 12, the second wiring portion 22, and the gate pad 33 are separated from the source electrode 32. In the example illustrated in FIG. 1, a pair of first wiring portions 12 is provided in the Y-direction. Multiple second wiring portions 22 are provided between the pair of first wiring portions 12. Multiple source electrodes 32 are provided respectively between the adjacent first wiring portion 12 and second wiring portion 22 and between the adjacent second wiring portions 22.

As illustrated in FIG. 3, the drain electrode 31 is provided at the lower surface of the semiconductor device 100. The $n^-$-type drift region 1 is provided on the drain electrode 31 with the $n^+$-type drain region 5 interposed. The $n^-$-type drift region 1 is electrically connected to the drain electrode 31 via the $n^+$-type drain region 5. The p-type base region 2 is provided on the $n^-$-type drift region 1. The $n^+$-type source region 3 and the $p^+$-type contact region 4 are provided on the p-type base region 2.

The source electrode 32 is provided on the $n^+$-type source region 3 and the $p^+$-type contact region 4. The source electrode 32 is electrically connected to the p-type base region 2, the $n^+$-type source region 3, and the $p^+$-type contact region 4. In the example illustrated in FIG. 3, a pair of $n^+$-type source regions 3 is provided on one p-type base region 2, and a plug 32a is provided under the source electrode 32. The plug 32a extends in the Z-direction between the $n^+$-type source regions 3. The lower end of the plug 32a is positioned in the p-type base region 2. The $p^+$-type contact region 4 is provided between the p-type base region 2 and the lower end of the plug 32a.

As illustrated in FIG. 4, the first conductive part 10 includes a buried electrode portion 11 and the first wiring portion 12. The second conductive part 20 includes the gate electrode portion 21 and the second wiring portion 22. The buried electrode portion 11 may be an example of a buried electrode in claimed inventions. The first wiring portion 12 may be an example of a first wire in claimed inventions. The gate electrode portion 21 may be an example of a gate electrode in claimed inventions. The second wiring portion 22 may be an example of a second wire in claimed inventions.

As illustrated in FIG. 3, the buried electrode portion 11 is buried in the $n^-$-type drift region 1 with a first insulating portion 11a interposed. The gate electrode portion 21 is provided on the buried electrode portion 11 with a second insulating portion 11b interposed. The gate electrode portion 21 faces the p-type base region 2 via a gate insulating portion 21a. The first insulating portion 11a may be an example of a first insulator in claimed inventions. The second insulating portion 11b may be an example of a second insulator in claimed inventions. The gate insulating portion 21a may be an example of a gate insulator in claimed inventions. In the example illustrated in FIG. 3, the gate electrode portion 21 also faces a portion of the $n^-$-type drift region 1 and a portion of the $n^+$-type source region 3.

As illustrated in FIGS. 2 and 3, multiple gate electrode portions 21 are provided in the X-direction. The gate electrode portions 21 each extend along the Y-direction. Similarly, a plurality is provided in the X-direction for each of the buried electrode portion 11, the p-type base region 2, the $n^+$-type source region 3, and the $p^+$-type contact region 4; and these pluralities extend along the Y-direction.

As illustrated in FIG. 4, the buried electrode portion 11 is electrically connected to the pair of first wiring portions 12 at the two Y-direction ends. The gate electrode portion 21 is electrically connected to the multiple second wiring portions 22. The first wiring portion 12 may be electrically connected to the gate electrode portion 21 in addition to the buried electrode portion 11.

As illustrated in FIGS. 1 and 2, the first wiring portion 12 of the first conductive part 10 is electrically connected to the gate pad 33. The second wiring portion 22 of the second conductive part 20 is electrically connected to the gate pad 33. The first conductive part 10 and the second conductive part 20 are electrically connected to each other. The electrical resistance of the first conductive part 10 is greater than the electrical resistance of the second conductive part 20.

The electrical resistance of the first conductive part 10 includes the electrical resistance of the buried electrode portion 11, the electrical resistance of the first wiring portion 12, the connection resistance between the buried electrode portion 11 and the first wiring portion 12, etc. The electrical resistance of the second conductive part 20 includes the electrical resistance of the gate electrode portion 21, the electrical resistance of the second wiring portion 22, the connection resistance between the gate electrode portion 21 and the second wiring portion 22, etc.

An operation of the semiconductor device 100 will now be described.

A voltage that is not less than a threshold is applied to the gate electrode portion 21 via the gate pad 33 in a state in which a positive voltage with respect to the source electrode 32 is applied to the drain electrode 31. A channel (an inversion layer) is formed in a region at the gate insulating portion 21a vicinity of the p-type base region 2; and the semiconductor device 100 is set to the on-state. Electrons flow from the source electrode 32 toward the drain electrode 31 via the channel and the n$^-$-type drift region 1. At this time, the voltage is applied also to the buried electrode portion 11. An accumulation layer is formed at the first insulating portion 11a vicinity of the n$^-$-type drift region 1 by the application of the voltage to the buried electrode portion 11. The on-resistance of the semiconductor device 100 is reduced thereby. Subsequently, when the voltage that is applied to the gate electrode portion 21 becomes less than the threshold, the channel in the p-type base region 2 disappears, and the semiconductor device 100 is set to the off-state.

When the semiconductor device 100 switches to the off-state, the voltage that is applied to the drain electrode 31 increases and is positive with respect to the buried electrode portion 11 and the gate electrode portion 21. A depletion layer spreads from the interface between the first insulating portion 11a and the n$^-$-type drift region 1 toward the n$^-$-type drift region 1 due to the increase of the positive voltage. The breakdown voltage of the semiconductor device 100 can be increased by the spreading of the depletion layer. Or, the on-resistance of the semiconductor device 100 can be reduced by increasing the n-type impurity concentration in the n$^-$-type drift region 1 while maintaining the breakdown voltage of the semiconductor device 100.

Examples of the materials of the components of the semiconductor device 100 will now be described.

The n$^-$-type drift region 1, the p-type base region 2, the n$^+$-type source region 3, the p$^+$-type contact region 4, and the n$^+$-type drain region 5 include silicon, silicon carbide, gallium nitride, or gallium arsenide as semiconductor materials. When silicon is used as the semiconductor material, arsenic, phosphorus, or antimony can be used as an n-type impurity. Boron can be used as a p-type impurity.

The buried electrode portion 11 and the gate electrode portion 21 include a conductive material such as polysilicon, etc. An impurity may be added to the conductive material.

The first insulating portion 11a, the second insulating portion 11b, and the gate insulating portion 21a include an oxide-based insulating material such as silicon oxide, etc.

The first wiring portion 12, the second wiring portion 22, the drain electrode 31, the source electrode 32, and the gate pad 33 include metals such as aluminum, copper, etc. The plug 32a includes a metal such as tungsten, etc.

Figure 5:
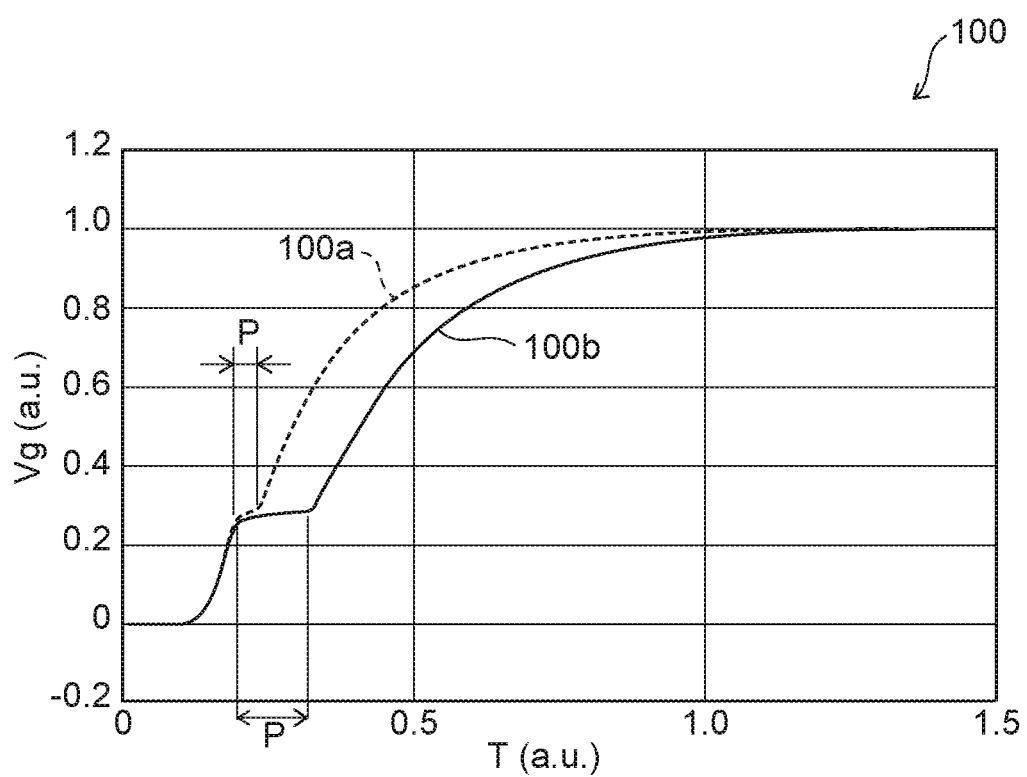
FIG. 5 is a graph illustrating characteristics of semiconductor devices according to a reference example.

FIG. 5 is a graph illustrating characteristics of semiconductor devices according to a reference example.

Figure 6:
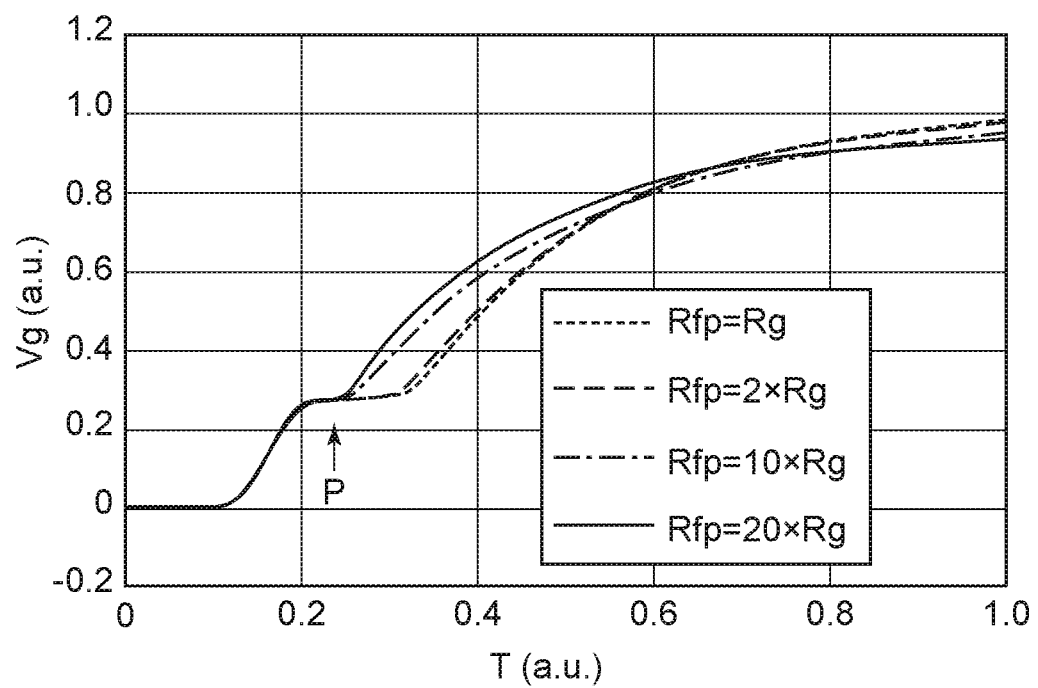
FIG. 6 is a graph illustrating characteristics of semiconductor devices according to the first embodiment.

FIG. 6 is a graph illustrating characteristics of semiconductor devices according to the first embodiment.

In FIGS. 5 and 6, the horizontal axis is a time T. The vertical axis is a voltage Vg of the gate electrode portion 21 with respect to the drain electrode 31. The time T and the voltage Vg have arbitrary units. FIGS. 5 and 6 illustrate simulation results of the change of the voltage of the gate electrode portion 21 when a voltage is applied to the gate pad 33.

In semiconductor devices 100a and 100b according to the reference example, the electrical resistance of the first conductive part 10 is equal to the electrical resistance of the second conductive part 20. In the semiconductor device 100a, the first conductive part 10 does not include the first wiring portion 12. The buried electrode portion 11 is electrically isolated from the gate pad 33 and is electrically connected to the source electrode 32. In the semiconductor device 100b, similarly to the semiconductor device 100, the first conductive part 10 is electrically connected to the gate pad 33.

Compared to the semiconductor device 100a, the on-resistance of the semiconductor device 100b is reduced by the accumulation layer formed in the n$^-$-type drift region 1 in the on-state. On the other hand, compared to the semiconductor device 100a, a capacitance Cgd between the drain electrode 31 and the gate pad 33 in the semiconductor device 100b is increased.

In the period in which the voltage between the drain electrode 31 and the source electrode 32 changes, a current that corresponds to the capacitance Cgd flows through the gate pad 33. In this period (the Miller period), the Miller effect occurs in which a huge capacitor equivalent to Gm times the capacitance Cgd appears to be connected between the gate pad 33 and the source electrode 32. Gm is the transconductance of the semiconductor device 100. In the Miller period, the huge capacitor appears as if charging or discharging is occurring, and the voltage Vg is substantially constant. It can be seen from FIG. 5 that compared to the semiconductor device 100a, a Miller period P of the semiconductor device 100b is increased by the increase of the capacitance Cgd. The power loss when switching the semiconductor device increases as the Miller period P lengthens. Therefore, from the perspective of reducing the power loss, it is desirable for the Miller period P to be short.

In the semiconductor device 100 according to the first embodiment, the electrical resistance of the first conductive part 10 is greater than the electrical resistance of the second conductive part 20. When the voltage of the gate pad 33 with respect to the drain electrode 31 changes, the change of the voltage of the buried electrode portion 11 is delayed from the change of the voltage of the gate electrode portion 21. Thereby, the charging or discharging of the capacitance Cgd component due to the first conductive part 10 is delayed from the charging or discharging of the capacitance Cgd component due to the second conductive part 20. When the voltage of the gate pad 33 changes, the capacitance Cgd component that is due to the first conductive part 10 does not easily appear as the Miller effect. In other words, the Miller period ends before the charging or discharging of the capacitance Cgd due to the first conductive part 10 is completed because the voltage between the drain electrode 31 and the source electrode 32 is reduced by the channel (the inversion layer) formed in the region at the gate insulating portion 21a vicinity of the p-type base region 2 by the potential of the gate electrode portion 21. As a result, the Miller period P in which the voltage Vg is substantially constant can be reduced.

FIG. 6 illustrates the change of the Miller period P when an electrical resistance Rg of the second conductive part 20 is fixed, and an electrical resistance Rfp of the first conductive part 10 is changed from 2 times to 20 times the resistance Rg. Compared to when the resistance Rfp and the resistance Rg are equal, it can be seen from FIG. 6 that when the resistance Rfp is 2 times the resistance Rg, the increase of the voltage Vg at the end of the Miller period P is steep, and the Miller period P is reduced. Therefore, it is favorable for the resistance Rfp to be not less than 2 times the resistance Rg. When the resistance Rfp is not less than 10 times the resistance Rg, compared to when the resistance Rfp and the resistance Rg are equal, the Miller period P is halved and is greatly reduced. Therefore, it is more favorable for the resistance Rfp to be not less than 10 times the resistance Rg.

Figure 7:
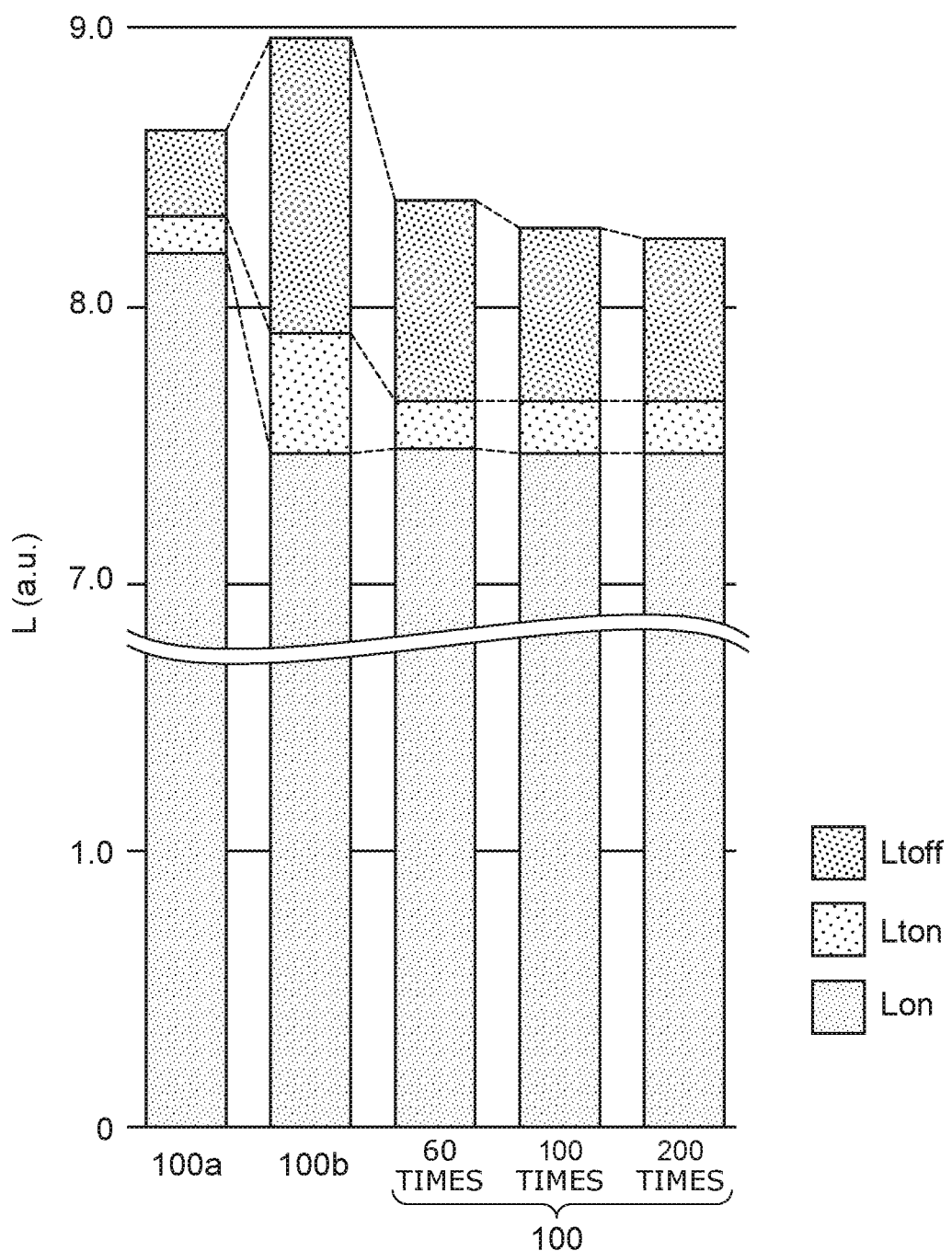
FIG. 7 is a graph illustrating characteristics of the semiconductor devices according to the reference example and the first embodiment.

FIG. 7 is a graph illustrating characteristics of the semiconductor devices according to the reference example and the first embodiment.

The vertical axis of FIG. 7 is a power loss L. The power loss L is shown as the sum of a power loss Lon in the on-state, a power loss Lton at turn-on, and a power loss Ltoff at turn-off. FIG. 7 illustrates simulation results when the turn-on time was 20 μs, and the output current of the gate driver was 2 A. The resistance Rg was fixed for each semiconductor device. The resistance Rfp was changed from 60 times to 200 times the resistance Rg in the semiconductor device 100 according to the first embodiment.

Comparing the semiconductor devices 100a and 100b, the power loss Lon of the semiconductor device 100b decreased compared to the semiconductor device 100a. On the other hand, the power loss Lton and Ltoff of the semiconductor device 100b increased compared to the semiconductor device 100a. As a result, it can be seen that the total power loss L of the semiconductor device 100b increased compared to the semiconductor device 100a.

Comparing the semiconductor devices 100 and 100a, the power loss Lon of the semiconductor device 100 decreased compared to the semiconductor device 100a. Similarly to the semiconductor device 100b, the power loss Lton and Ltoff of the semiconductor device 100 increased compared to the semiconductor device 100a. However, the increase amount was suppressed compared to the semiconductor device 100a. As a result, the total power loss L of the semiconductor device 100 decreased compared to the semiconductor device 100a. Also, it can be seen that the power loss L decreases as the resistance Rfp increases.

On the other hand, if the resistance Rfp is excessively large, the potential of the buried electrode portion 11 easily fluctuates when a current flows through the buried electrode portion 11 when switching the semiconductor device 100. For example, the potential difference between the drain electrode 31 and the buried electrode portion 11 temporarily becomes large, and avalanche breakdown easily occurs in the n⁻-type drift region 1. As a result, there is a possibility that the breakdown voltage of the semiconductor device 100 may decrease. To suppress the decrease of the breakdown voltage, it is favorable for the resistance Rfp to be not more than 300 times the resistance Rg.

It is favorable for the electrical resistivity of the buried electrode portion 11 to be greater than the electrical resistivity of the gate electrode portion 21 so that the resistance Rfp becomes greater than the resistance Rg. For example, the electrical resistivity of the buried electrode portion 11 can be increased by reducing the length in the X-direction and the length in the Z-direction of the buried electrode portion 11, When an impurity is added to the buried electrode portion 11 and the gate electrode portion 21, the impurity concentration in the buried electrode portion 11 may be less than the impurity concentration in the gate electrode portion 21. As illustrated in FIG. 4, the difference between the resistance Rg and the resistance Rfp may be increased by setting the number of the second wiring portions 22 to be greater than the number of the first wiring portions 12.

A method for determining the resistance Rg and the resistance Rfp will now be described.

Figure 8:
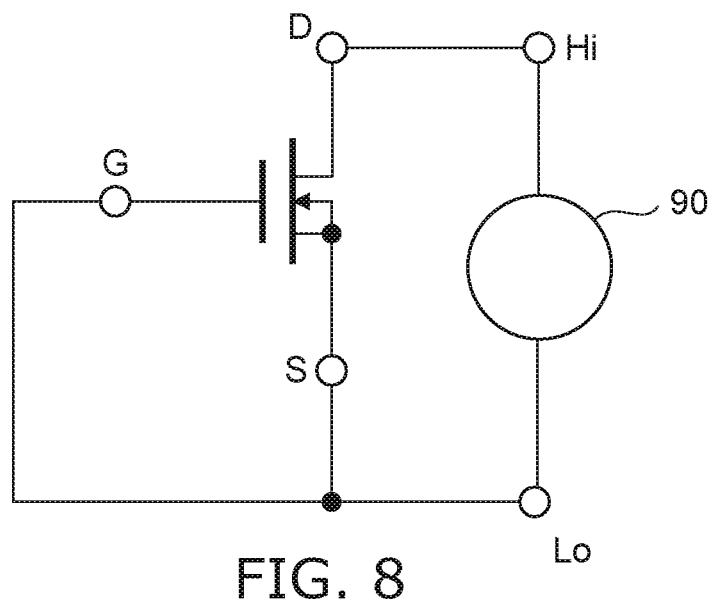
FIG. 8 is a schematic view illustrating a method for measuring the capacitance of the semiconductor device according to the first embodiment.
Figure 11:
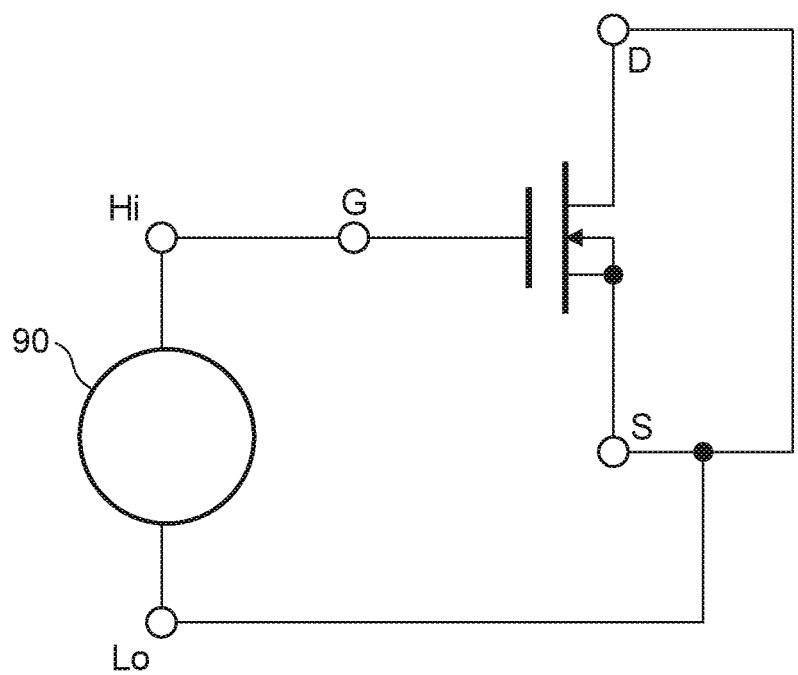
FIG. 11 is a schematic view illustrating a method for measuring the capacitance of the semiconductor device according to the first embodiment.

FIGS. 8 and 11 are schematic views illustrating a method for measuring the capacitance of the semiconductor device according to the first embodiment.

Figure 9:
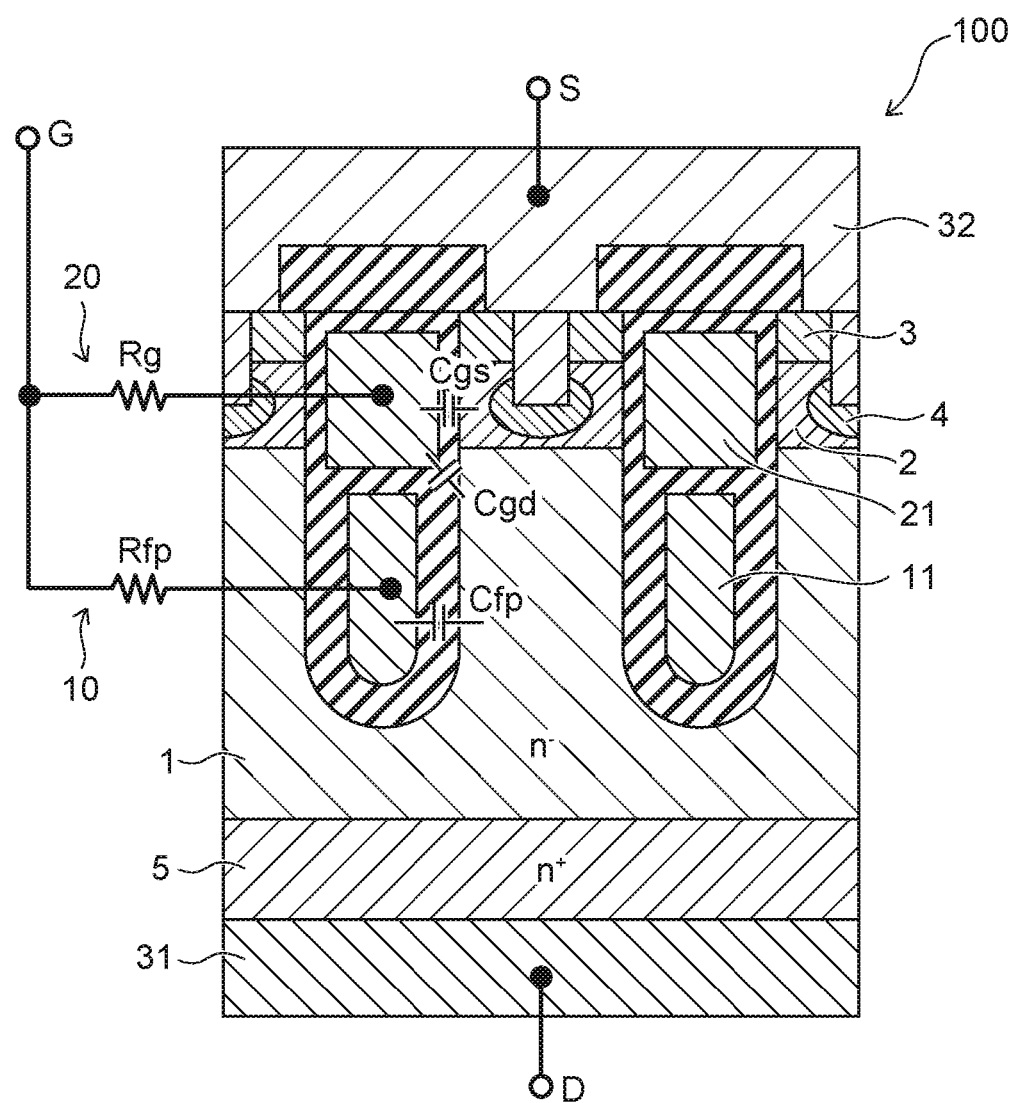
FIG. 9 is a schematic view showing the resistances and the capacitances of the semiconductor device according to the first embodiment.

FIG. 9 is a schematic view showing the resistances and the capacitances of the semiconductor device according to the first embodiment.

Figure 10:
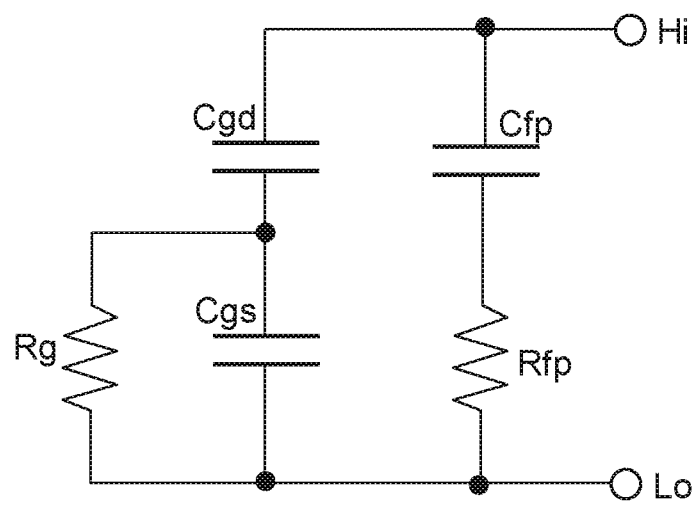
FIG. 10 is an equivalent circuit diagram when measuring the capacitances.
Figure 12:
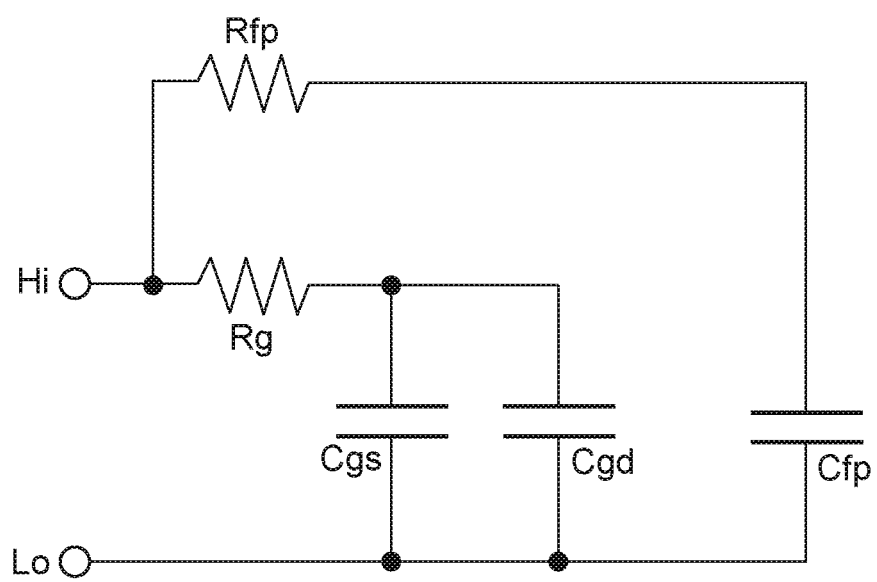
FIG. 12 is an equivalent circuit diagram when measuring the capacitances.

FIGS. 10 and 12 are equivalent circuit diagrams when measuring the capacitances.

In FIGS. 8 and 11, the drain electrode 31 corresponds to a terminal D. The source electrode 32 corresponds to a terminal S. The gate pad 33 corresponds to a terminal G.

An LCR meter is used to determine the resistance Rg and the resistance Rfp. First, the impedance of an output capacitor Coss is measured. The output capacitor Coss is the sum of a capacitance Cfp and the capacitance Cgd. As illustrated in FIG. 8, the terminals G and S are shorted. A terminal Hi on the high-voltage side of the LCR meter 90 is connected to the terminal D. A terminal Lo on the low-voltage side of the LCR meter 90 is connected to the terminals G and S.

In such a case, as illustrated in FIG. 9, the capacitance Cgd, the capacitance Cfp, a capacitance Cgs, the resistance Rg, and the resistance Rfp exist in the semiconductor device 100 between the terminal Hi and the terminal Lo. In FIG. 9, the capacitance Cfp represents the capacitance between the n⁻-type drift region 1 and the buried electrode portion 11. The capacitance Cgd represents the capacitance between the n⁻-type drift region 1 and the gate electrode portion 21. The capacitance Cgs represents the capacitance between the p-type base region 2 and the gate electrode portion 21. The p-n junction capacitance between the n⁻-type drift region 1 and the p-type base region 2 is sufficiently small compared to the capacitance Cfp and can be ignored.

The resistances and the capacitances of the semiconductor device 100 illustrated in FIG. 9 are equivalently illustrated in the circuit diagram shown in FIG. 10. In the semiconductor device 100, the resistance Rg is less than the resistance Rfp. Therefore, the resistance Rg and the capacitance Cgs are ignored. An impedance Z of the output capacitor Coss at this time is represented by Formula 1.

$$Z \cong \frac{Cfp^2}{(Cgd + Cfp)^2} R_{fp} + \frac{1}{jw(Cfp + Cgd)} \quad \text{[Formula 1]}$$

The capacitance Cgd is small with respect to the capacitance Cfp. Therefore, Formula 1 can be represented by Formula 2.

$$Z \cong R_{fp} \to \frac{1}{jwCfp} \quad \text{[Formula 2]}$$

In other words, the measurement result of the real part (the resistance) of the impedance can be considered to be the resistance Rfp.

After determining the resistance Rfp, the impedance of an input capacitance Ciss is measured. The input capacitance Ciss is the sum of the capacitance Cgd and the capacitance Cgs. As illustrated in FIG. 11, the terminals G and S are shorted. The terminal Hi on the high-voltage side of the LCR meter 90 is connected to the terminal D. The terminal Lo on the low-voltage side of the LCR meter 90 is connected to the terminals G and S.

For such a case, the resistances and the capacitances of the semiconductor device 100 illustrated in FIG. 9 are equivalently illustrated in the circuit diagram shown in FIG. 12. The impedance Z of the input capacitance Ciss is represented by Formula 3.

$$Z \cong \frac{R_g R_{fp}}{R_g + R_{fp}} + \frac{1}{jw} \cdot \frac{(R_g + R_{fp})\{R_{fp}Cfp + R_g(Cgs + Cgd) + 1\} - R_g R_{fp}(Cgs + Cgd + Cfp)}{(R_g + R_{fp})(Cgs + Cgd)Cfp} \quad \text{[Formula 3]}$$

The resistance Rfp that is determined by the method described above is substituted into the real part of Formula 3. The resistance Rg can be calculated by comparing the formula of the real part after substituting and the measurement result of the real part of the impedance.

First and Second Modifications

Figure 13:
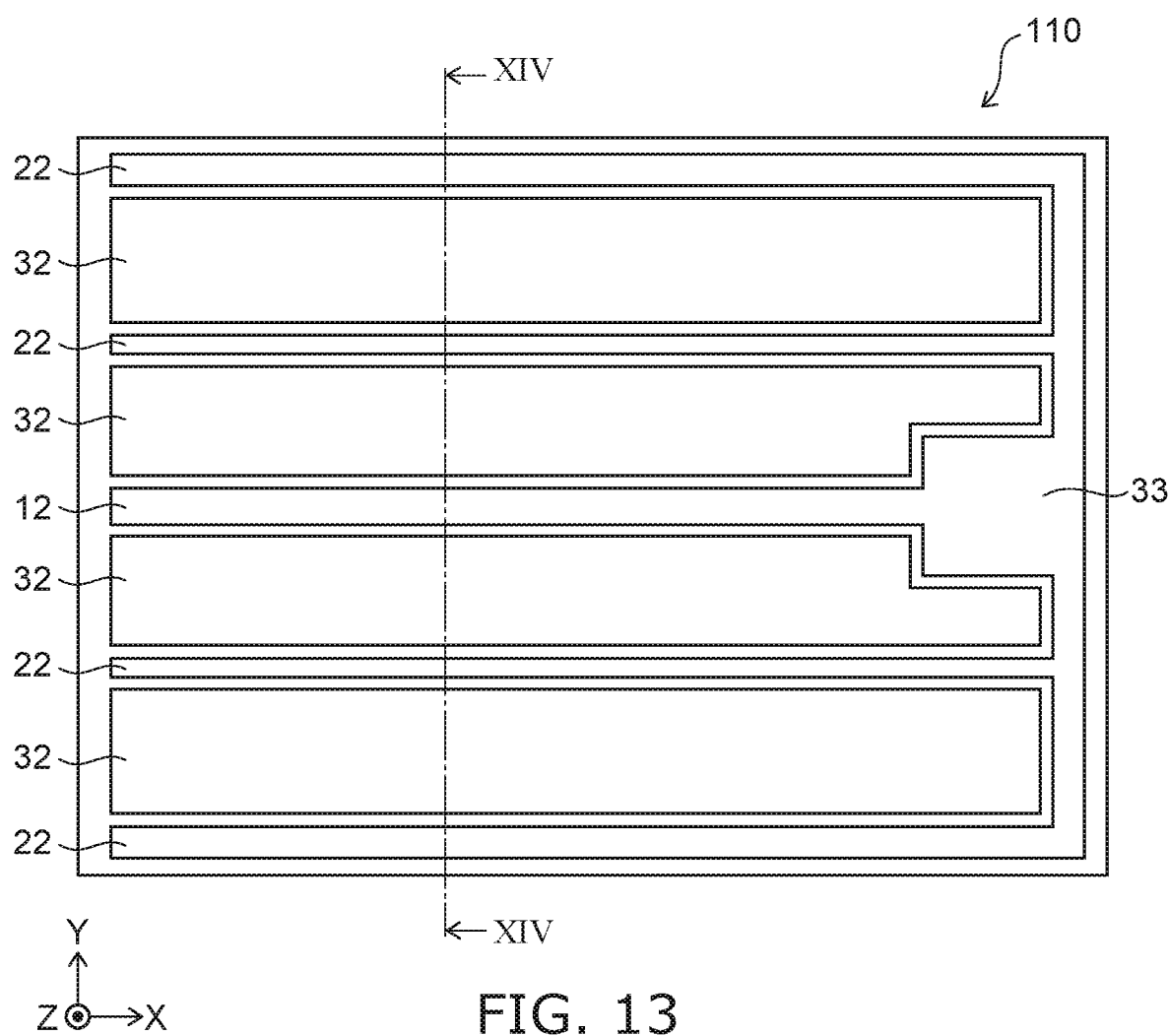
FIG. 13 is a plan view illustrating a semiconductor device according to a first modification of the first embodiment.
Figure 14:
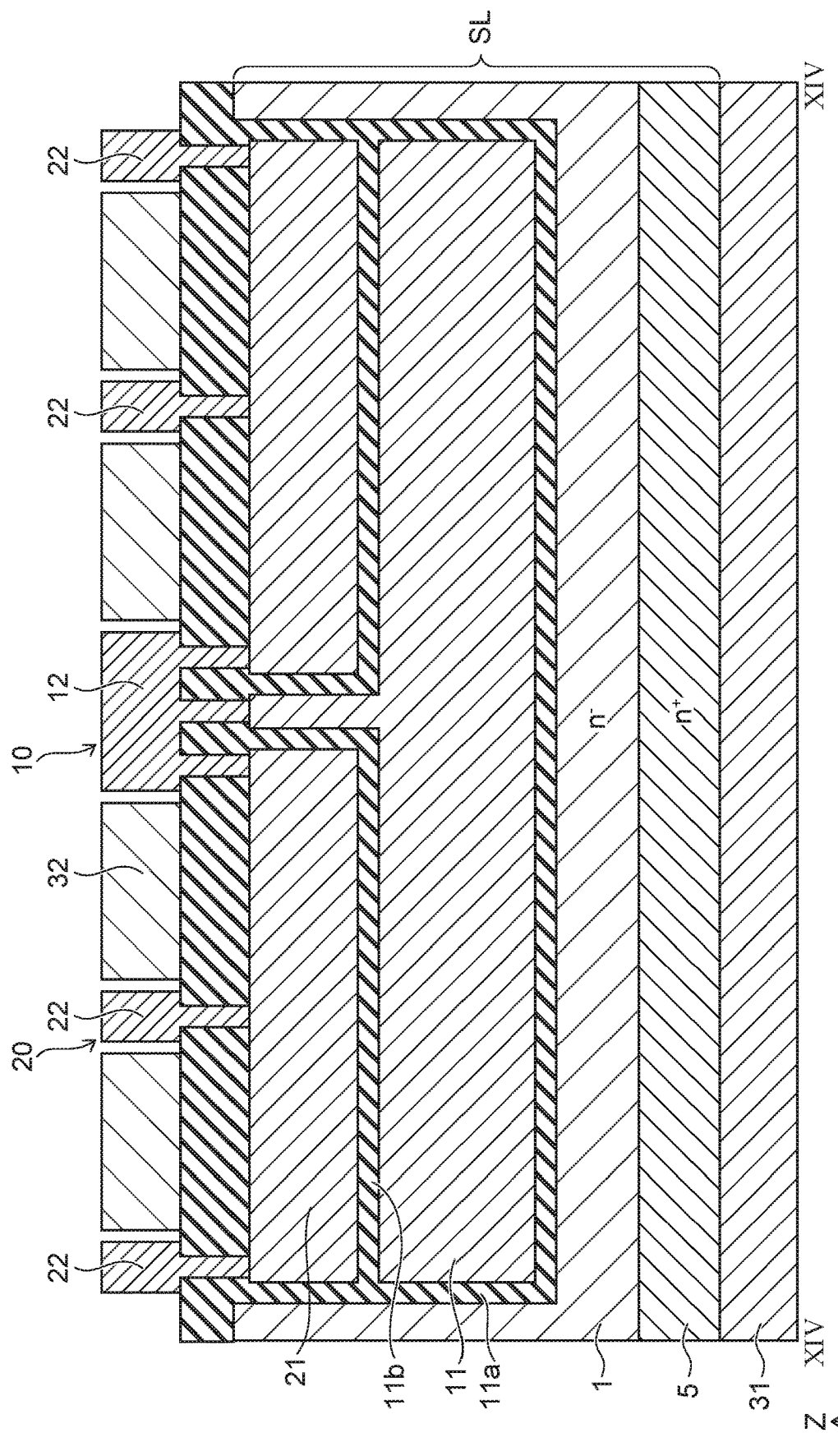
FIG. 14 is a XIV-XIV cross-sectional view of FIG. 13.

FIG. 13 is a plan view illustrating a semiconductor device according to a first modification of the first embodiment. FIG. 14 is a XIV-XIV cross-sectional view of FIG. 13.

Figure 15:
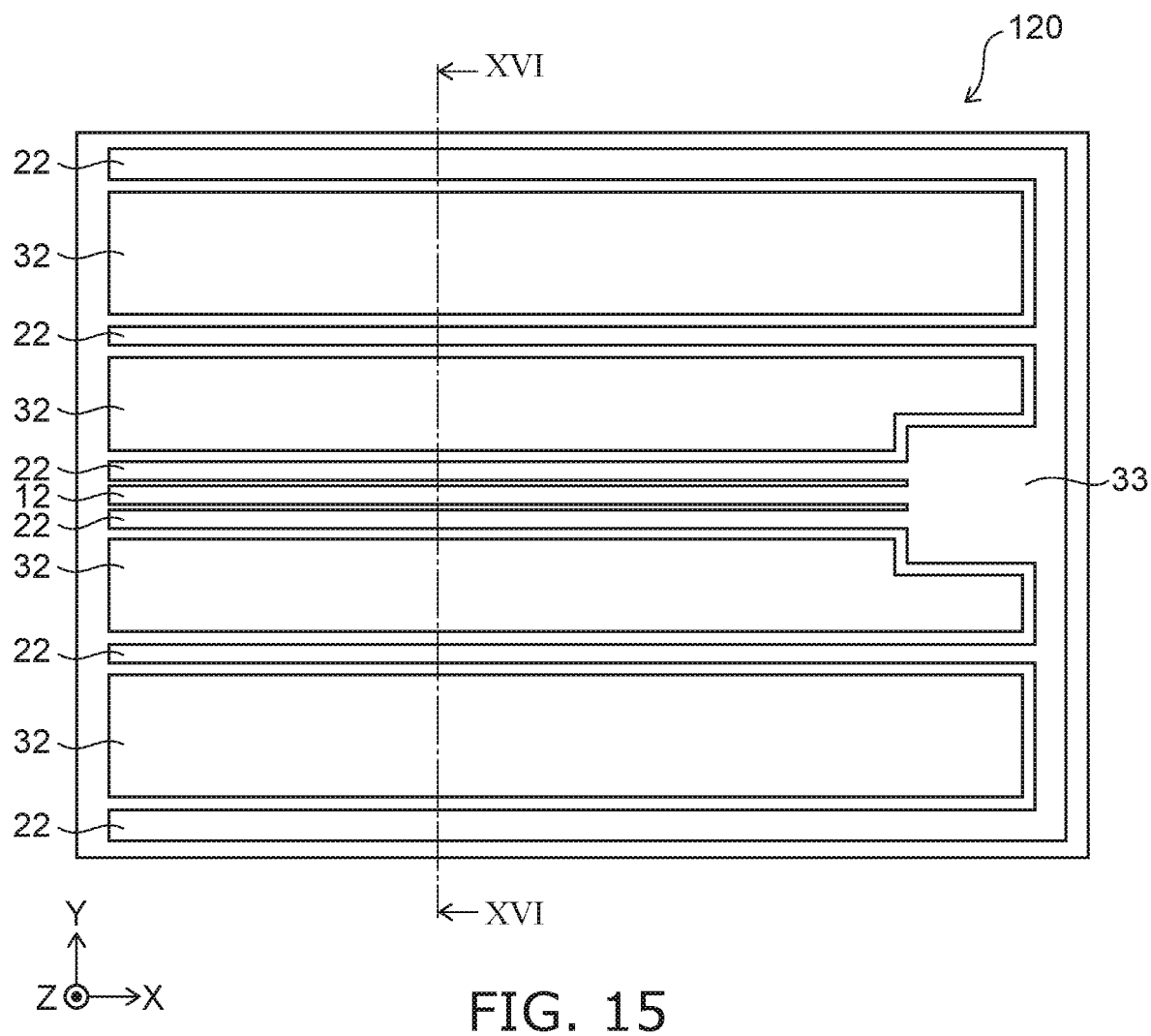
FIG. 15 is a plan view illustrating a semiconductor device according to a second modification of the first embodiment.
Figure 16:
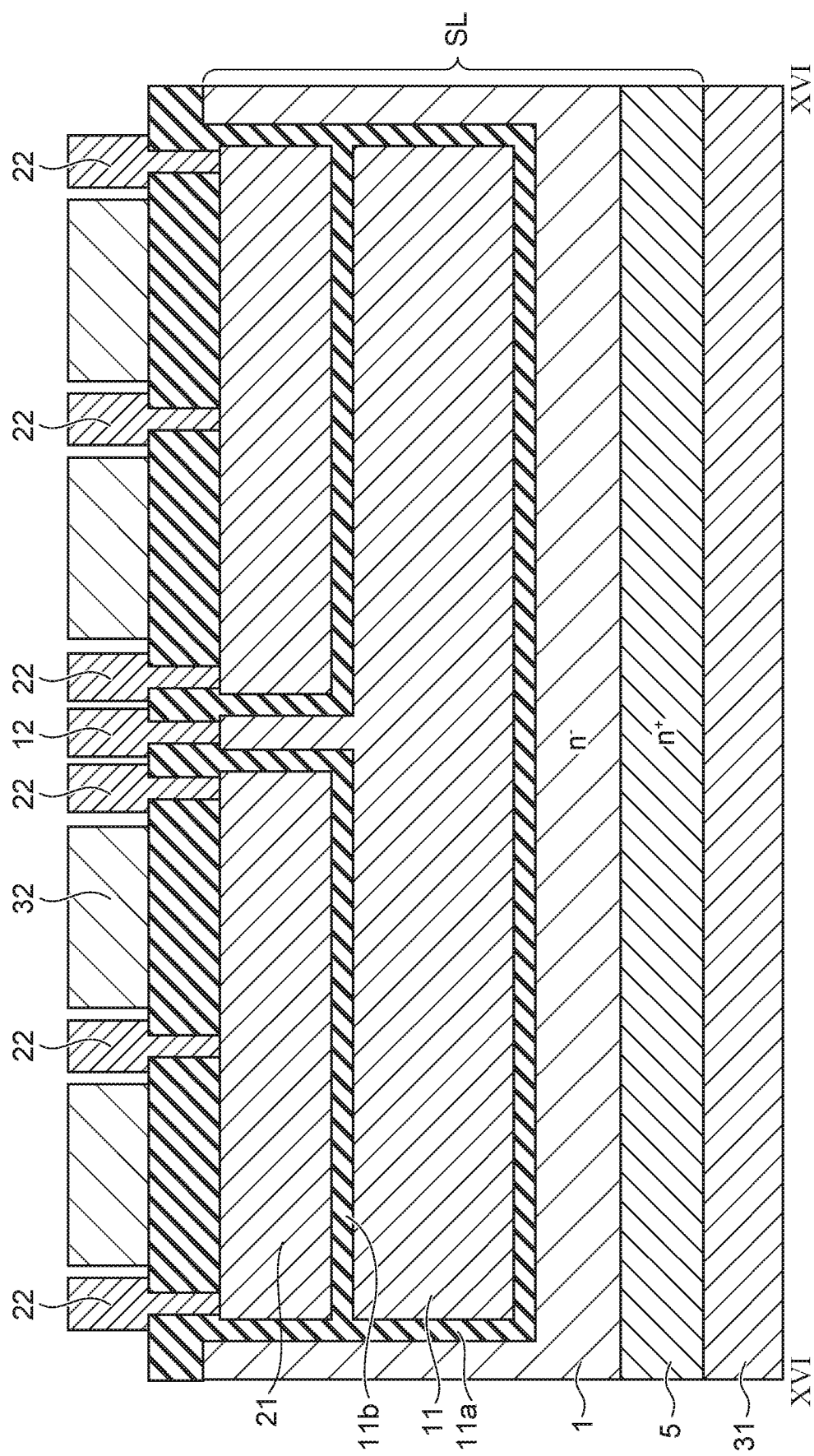
FIG. 16 is a XVI-XVI cross-sectional view of FIG. 15.

FIG. 15 is a plan view illustrating a semiconductor device according to a second modification of the first embodiment. FIG. 16 is a XVI-XVI cross-sectional view of FIG. 15.

In the semiconductor device 110 according to the first modification illustrated in FIGS. 13 and 14, compared to the semiconductor device 100, the ratio of the number of the first wiring portions 12 to the number of the second wiring portions 22 is small. The electrical resistance between the buried electrode portion 11 and the gate pad 33 increases as the number of the first wiring portions 12 decreases. Therefore, compared to the semiconductor device 100, the electrical resistance of the first conductive part 10 of the semiconductor device 110 is large.

In the semiconductor device 120 according to the second modification illustrated in FIGS. 15 and 16, the ratio of the number of the second wiring portions 22 to the number of the first wiring portions 12 is large compared to the semiconductor device 110. The electrical resistance between the gate electrode portion 21 and the gate pad 33 decreases as the number of the second wiring portions 22 increases. Therefore, compared to the semiconductor device 110, the electrical resistance of the second conductive part 20 of the semiconductor device 120 is small.

According to the first or second modification, the difference between the electrical resistance of the first conductive part 10 and the electrical resistance of the second conductive part 20 can be increased with a simple structure.

The difference between the electrical resistance of the first conductive part 10 and the electrical resistance of the second conductive part 20 may be increased by adjusting the sizes of the first wiring portion 12 and the second wiring portion 22. For example, the thickness in the Z-direction of the first wiring portion 12 may be less than the thickness in the Z-direction of the second wiring portion 22. The width of the first wiring portion 12 may be less than the width of the second wiring portion 22. The width of each wiring portion corresponds to the length of each wiring portion in a direction perpendicular to the direction in which the wiring portion extends.

Third Modification

Figure 17:
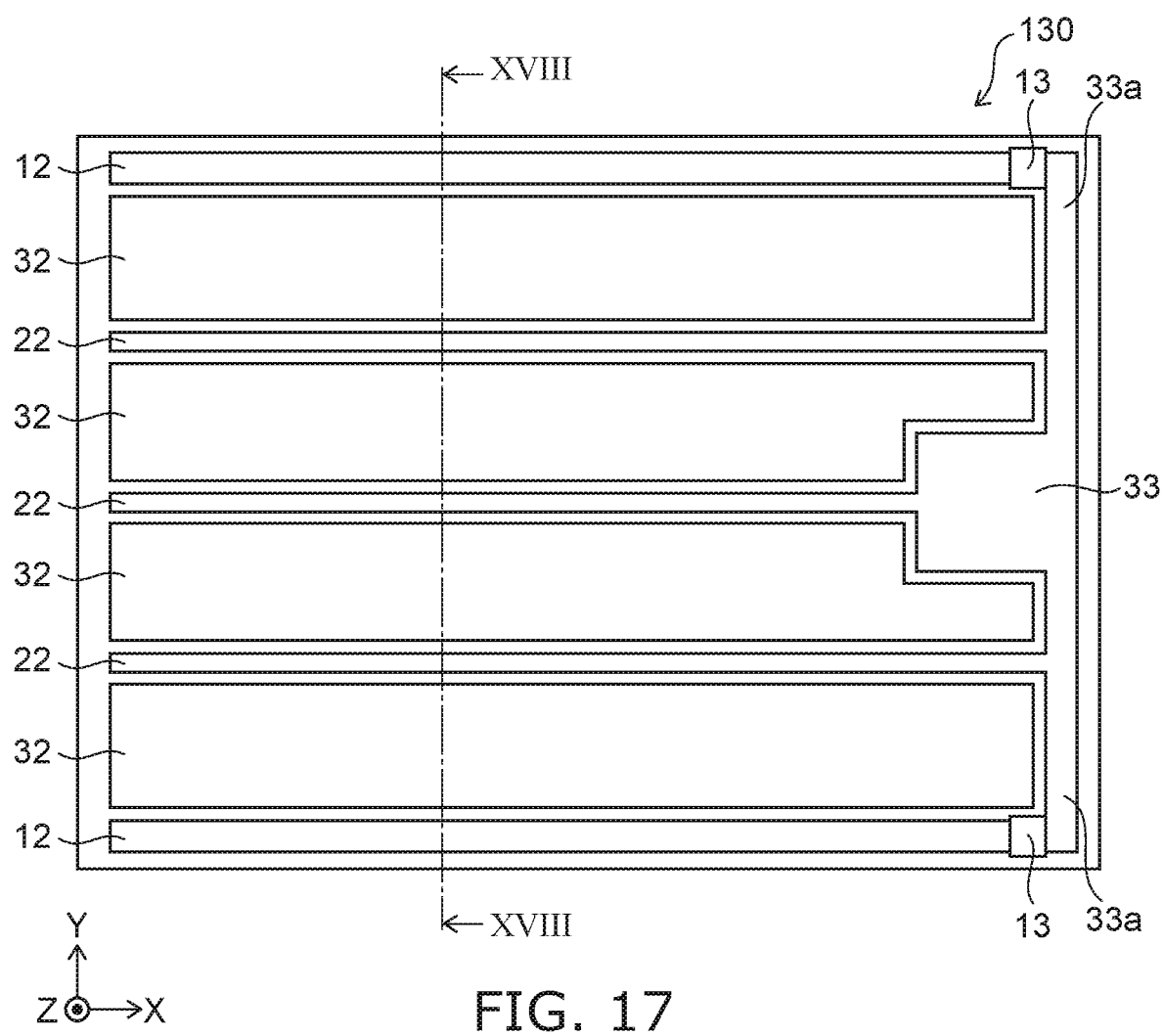
FIG. 17 is a plan view illustrating a semiconductor device according to a third modification of the first embodiment.

FIG. 17 is a plan view illustrating a semiconductor device according to a third modification of the first embodiment.

Figure 18:
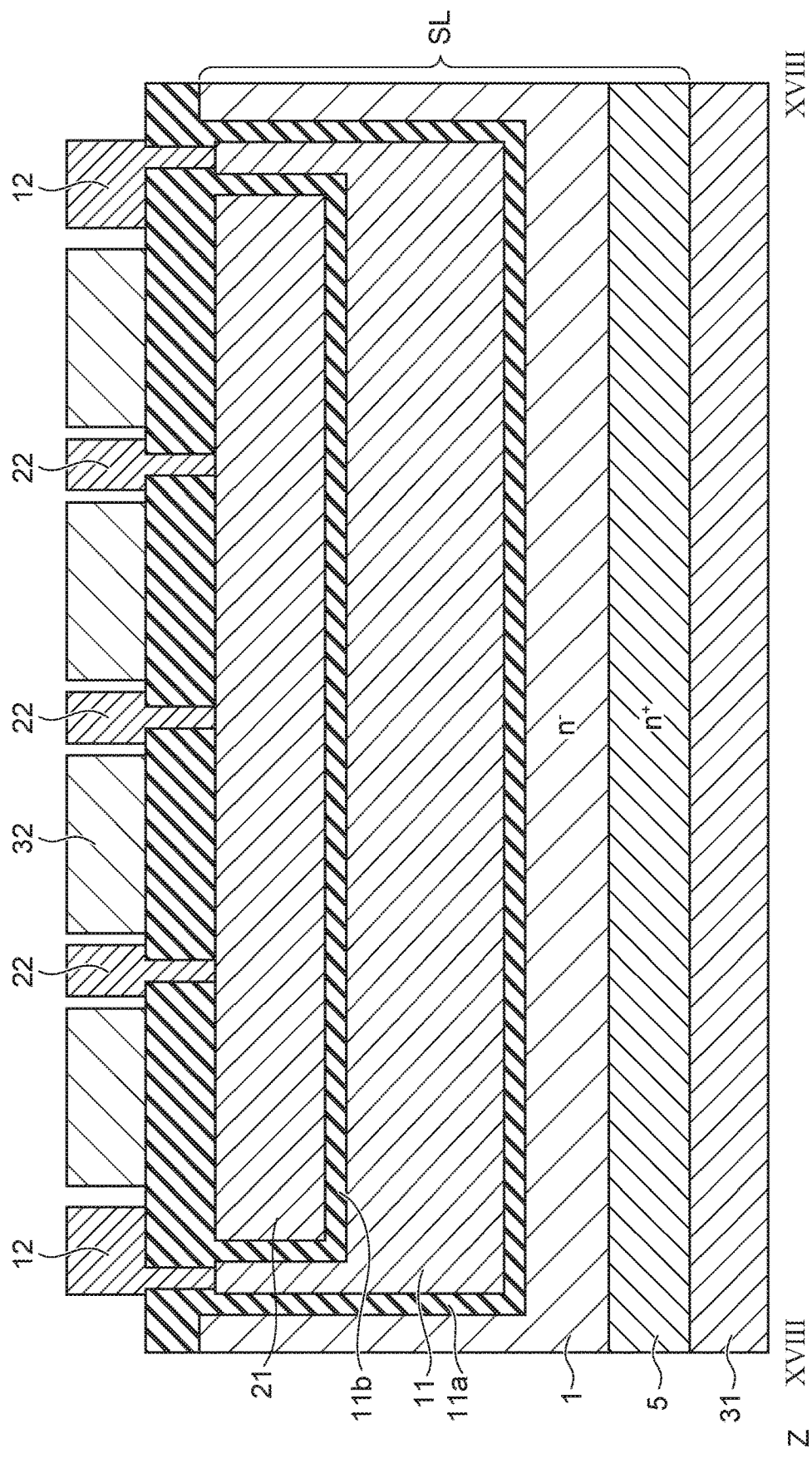
FIG. 18 is a XVIII-XVIII cross-sectional view of FIG. 17.

FIG. 18 is a XVIII-XVIII cross-sectional view of FIG. 17.

Figure 19A:
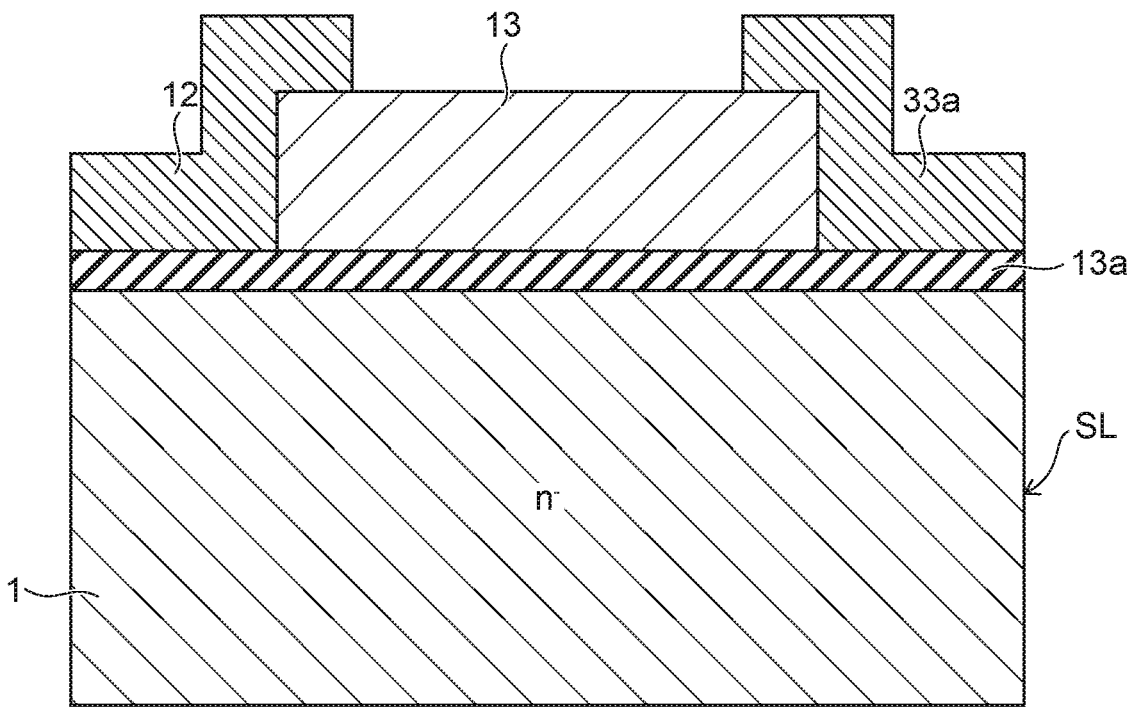
FIGS. 19A and 19B are cross-sectional views illustrating a portion of the semiconductor device according to the third modification of the first embodiment.
Figure 19B:
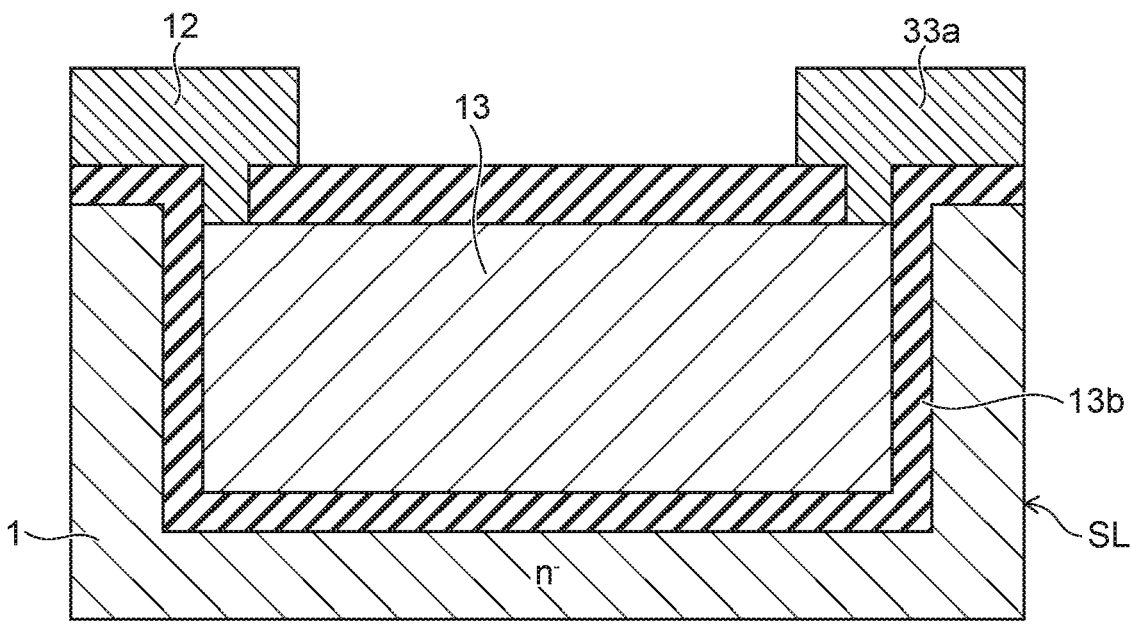

FIGS. 19A and 19B are cross-sectional views illustrating a portion of the semiconductor device according to the third modification of the first embodiment.

In the semiconductor device 130 according to the third modification, the first conductive part 10 further includes a wiring resistance 13 as illustrated in FIG. 17.

The wiring resistance 13 is electrically connected between the gate pad 33 and the first wiring portion 12. In the example illustrated in FIG. 17 and FIGS. 19A and 19B, a wiring portion 33a that extends in the Y-direction is electrically connected to the gate pad 33. The second wiring portion 22 is electrically connected to the gate pad 33 or the wiring portion 33a. The wiring resistance 13 is electrically connected between the first wiring portion 12 and the wiring portion 33a. To set the electrical resistivity of the first conductive part 10 to be high compared to the second conductive part 20, the first wiring portion 12 is not connected to the gate electrode portion 21 as illustrated in FIG. 18.

The electrical resistivity of the wiring resistance 13 is greater than the electrical resistivities of the first wiring portion 12, the second wiring portion 22, the gate pad 33, and the wiring portion 33a, For example, the electrical resistivity of the wiring resistance 13 is greater than the electrical resistivity of the buried electrode portion 11.

The material of the wiring resistance 13 is arbitrary as long as the relationship of the electrical resistivities described above can be realized. For example, the wiring resistance 13 includes polysilicon. The impurity concentration in the wiring resistance 13 is less than the impurity concentration in the buried electrode portion 11.

The wiring resistance 13 may be provided on the semiconductor layer SL or may be provided in the semiconductor layer SL. The wiring resistance 13 is electrically isolated from the semiconductor layer SL. For example, as illustrated in FIG. 19A, the wiring resistance 13 is provided on the semiconductor layer SL with an insulating layer 13a interposed. Or, as illustrated in FIG. 19B, the wiring resistance 13 is provided in the semiconductor layer SL with an insulating layer 13b interposed.

Compared to the structure illustrated in FIG. 19A, the level difference of the semiconductor layer SL surface is reduced in the structure illustrated in FIG. 19B. Lithography is easier when forming a contact above the wiring resistance 13. Also, the wiring resistance 13 can be made using the same formation processes as the buried electrode portion 11 or the gate electrode portion 21, and the number of processes necessary for manufacturing the semiconductor device 130 can be reduced.

By providing the wiring resistance 13, the difference between the electrical resistance of the first conductive part 10 and the electrical resistance of the second conductive part 20 can be further increased.

Fourth Modification

Figure 20:
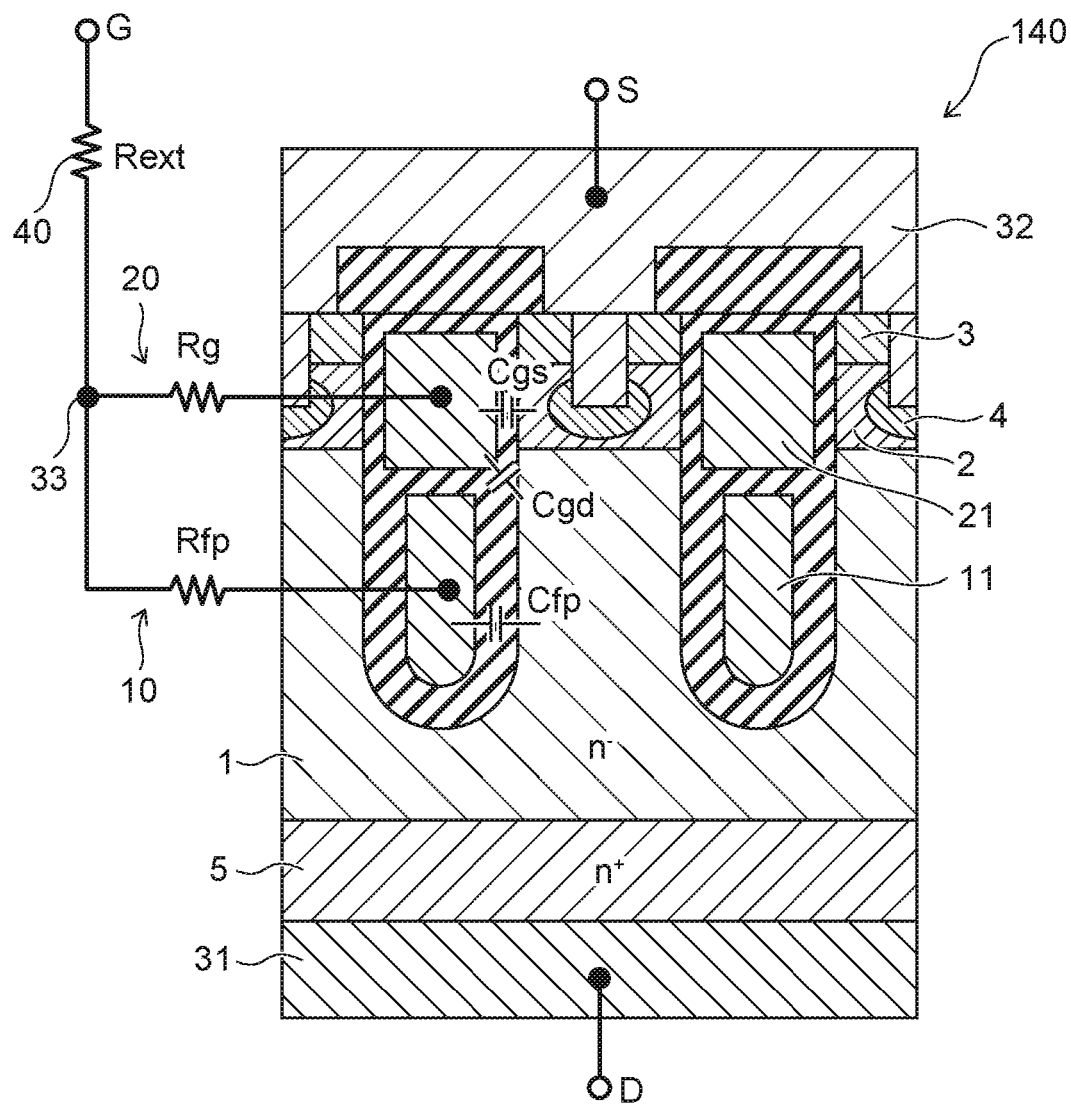
FIG. 20 is a schematic view illustrating a semiconductor device according to a fourth modification of the first embodiment.

FIG. 20 is a schematic view illustrating a semiconductor device according to a fourth modification of the first embodiment.

As illustrated in FIG. 20, compared to the semiconductor device 100, the semiconductor device 140 according to the fourth modification further includes a resistor 40.

The gate pad 33 is electrically connected between the first conductive part 10 and the resistor 40 and between the second conductive part 20 and the resistor 40. For example, an electrical resistance Rext of the resistor 40 is greater than the electrical resistance Rg of the second conductive part 20. The electrical resistance Rfp of the first conductive part 10 is greater than the resistance Rext. Favorably, the resistance Rfp is not less than 5 times and not more than 150 times the resistance Rext.

The material of the resistor 40 is arbitrary as long as the relationship of the electrical resistivities described above can be realized. For example, the resistor 40 is formed of polysilicon in which the impurity concentration is adjusted, single-crystal silicon, or a metal having an adjusted width. For example, the metal is at least one selected from the group consisting of aluminum, copper, titanium nitride, and tungsten nitride.

Fifth Modification

Figure 21:
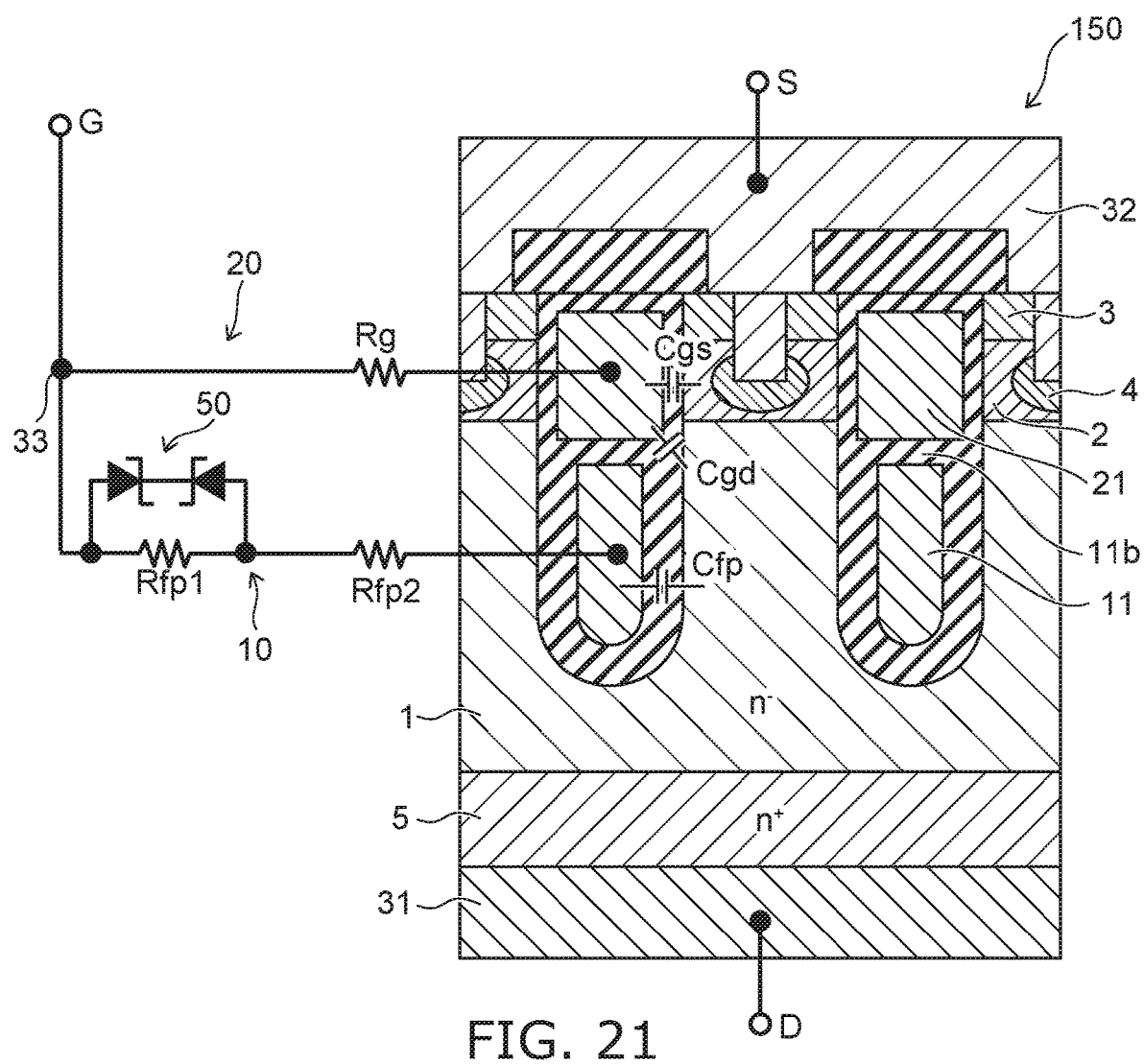
FIG. 21 is a schematic view illustrating a semiconductor device according to a fifth modification of the first embodiment.

FIG. 21 is a schematic view illustrating a semiconductor device according to a fifth modification of the first embodiment.

Figure 22:
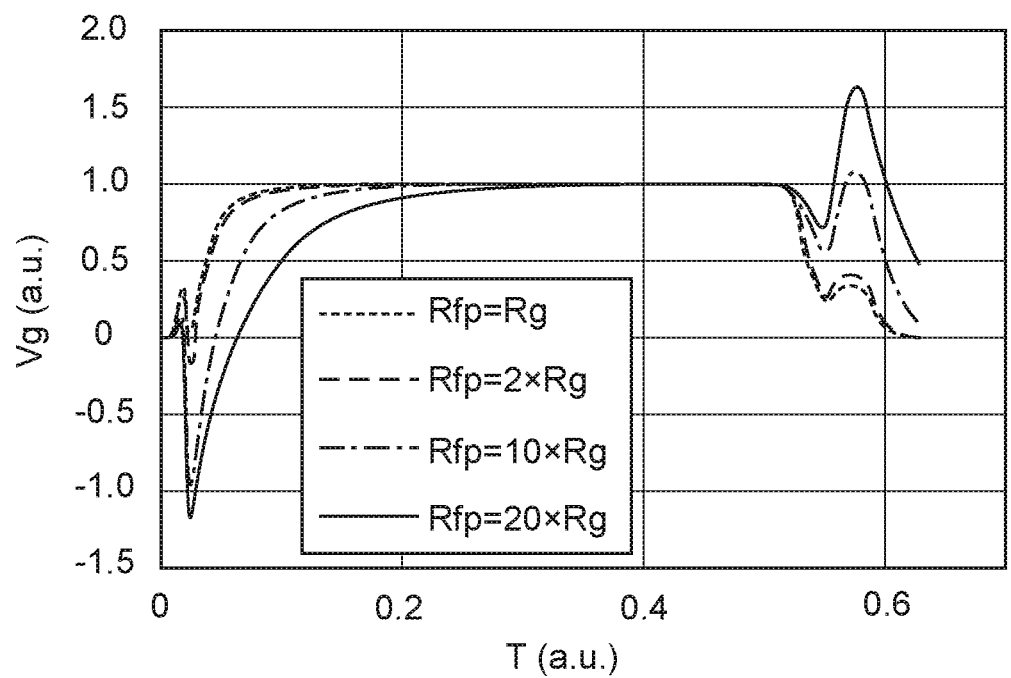
FIG. 22 is a graph illustrating characteristics of the semiconductor device.

FIG. 22 is a graph illustrating characteristics of the semiconductor device.

Figure 23:
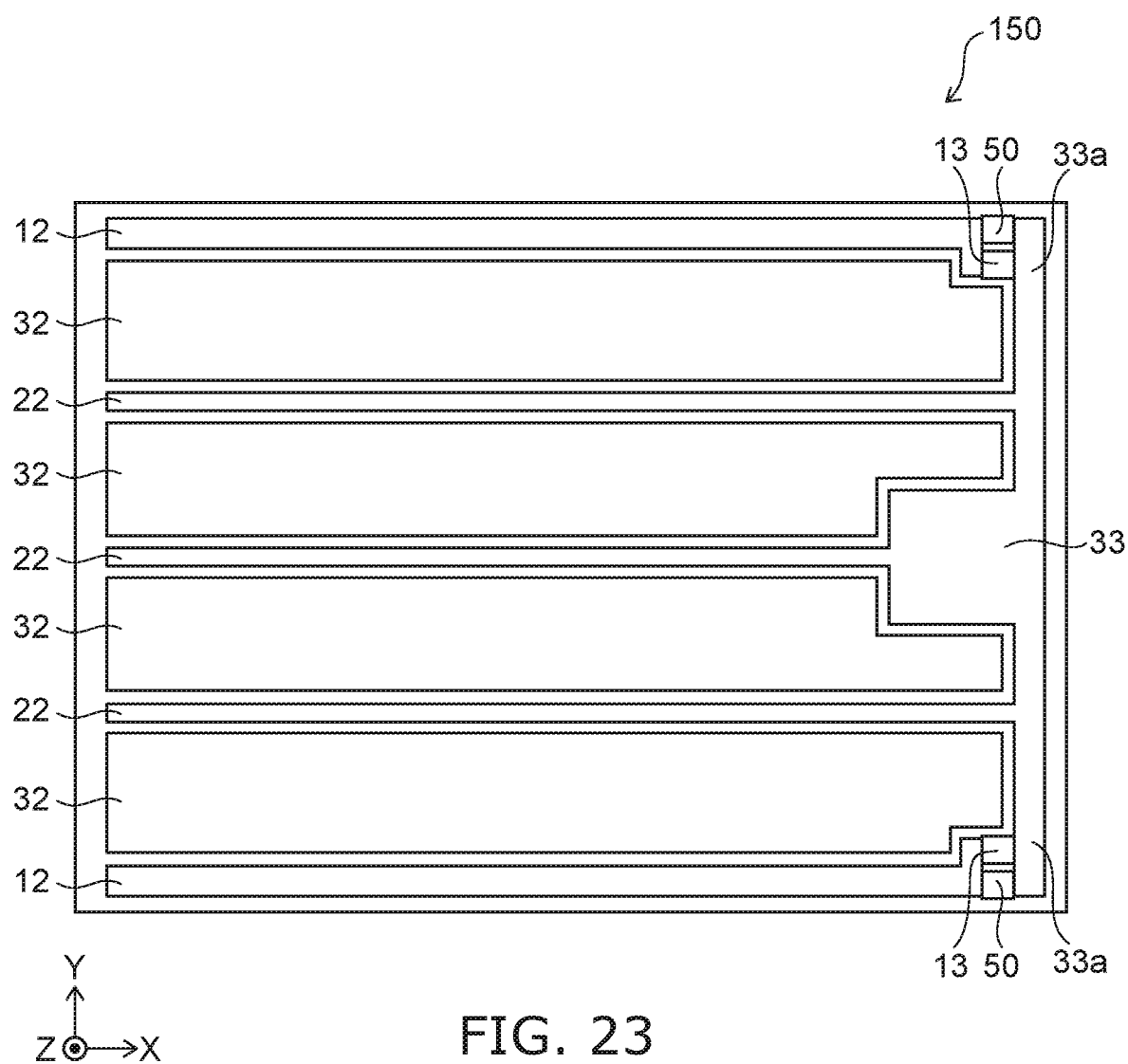
FIG. 23 is a plan view illustrating the semiconductor device according to the fifth modification of the first embodiment.

FIG. 23 is a plan view illustrating the semiconductor device according to the fifth modification of the first embodiment.

Figure 24A:
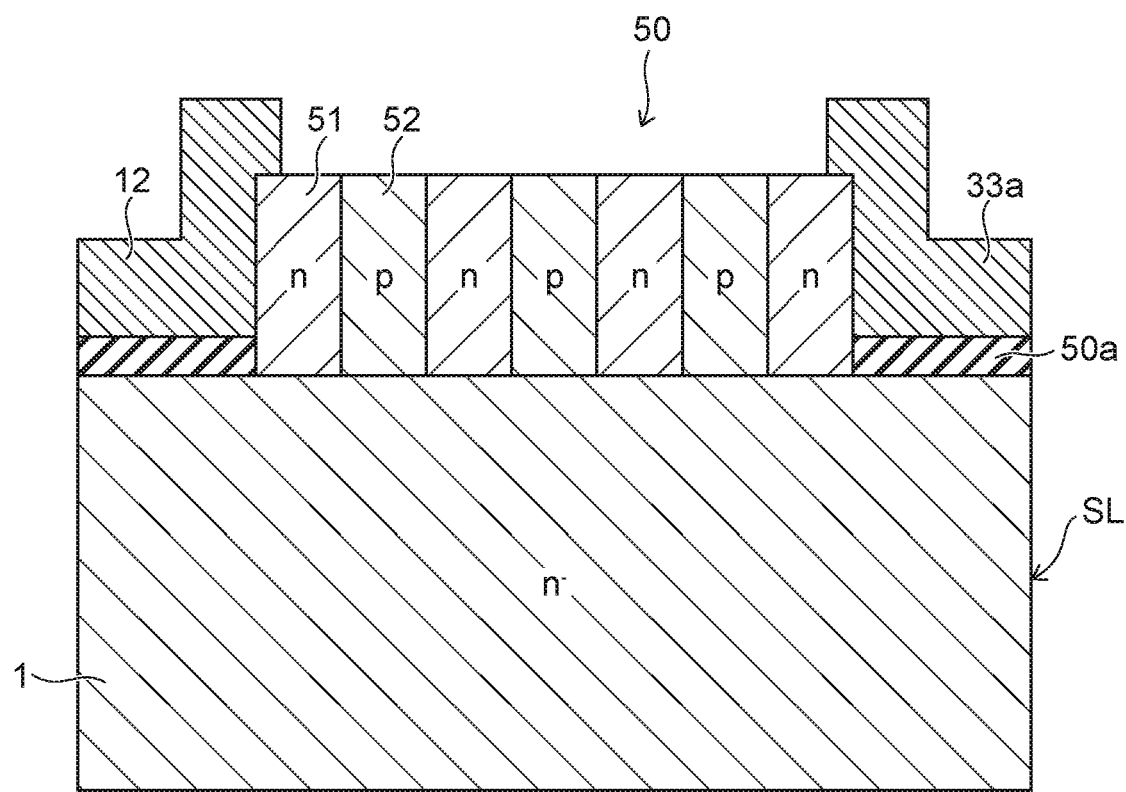
FIGS. 24A and 24B are cross-sectional views illustrating a portion of the semiconductor device according to the fifth modification of the first embodiment.
Figure 24B:
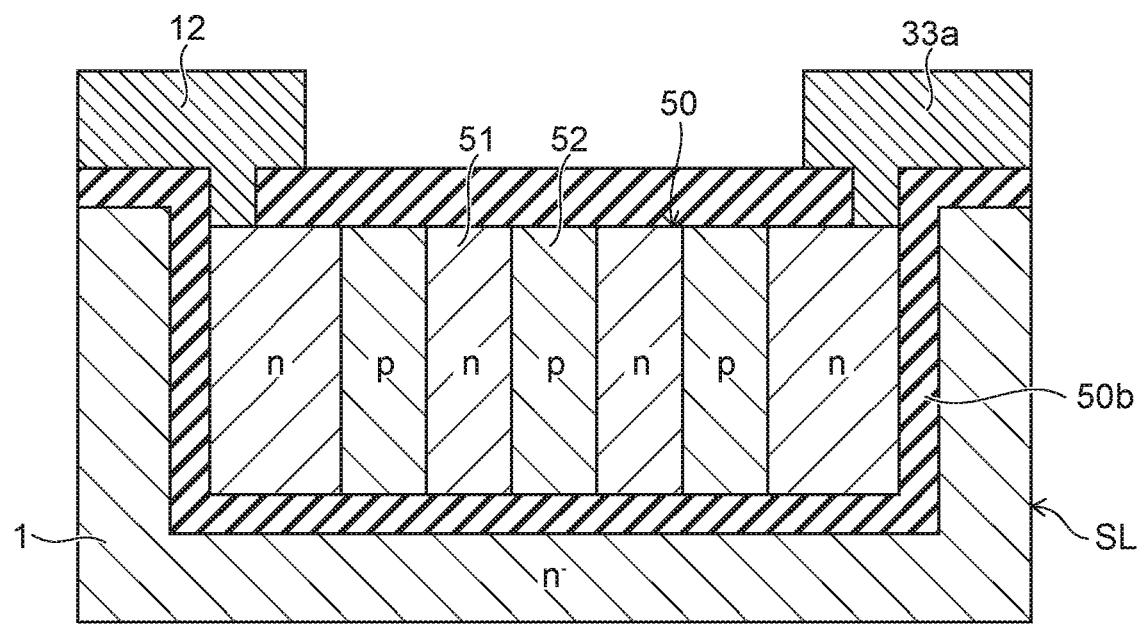

FIGS. 24A and 24B are cross-sectional views illustrating a portion of the semiconductor device according to the fifth modification of the first embodiment.

As illustrated in FIG. 21, compared to the semiconductor device 100, the semiconductor device 150 according to the fifth modification further includes a bidirectional zener diode 50.

The zener diode 50 is electrically connected between the first conductive part 10 and the gate pad 33. When a larger voltage is applied to one of the first conductive part 10 or the second conductive part 20, the zener diode 50 causes a current to flow from the one to the other of the first conductive part 10 or the second conductive part 20. The likelihood of the semiconductor device 150 being damaged by the application of a high voltage to the first conductive part 10 and the gate pad 33 can be reduced thereby.

The zener diode 50 includes, for example, polysilicon or single-crystal silicon. The breakdown voltage of the zener diode 50 is arbitrary. When a reverse voltage is applied, a current may flow in the zener diode 50 due to Zener breakdown or due to avalanche breakdown.

In FIG. 22, the horizontal axis is the time T. The vertical axis is the voltage Vg of the gate electrode portion 21 with respect to the drain electrode 31. The time T and the voltage Vg have arbitrary units. FIG. 22 illustrates simulation results of the change of the voltage of the buried electrode portion 11 when the voltage of the gate pad 33 is changed. Specifically, a voltage is applied to the gate pad 33 when the time T=0. The application of the voltage to the gate pad 33 is stopped when the time T=0.5.

It can be seen from FIG. 22 that the fluctuation of the voltage of the buried electrode portion 11 increases as the resistance Rfp becomes greater than the resistance Rg. When the voltage of the buried electrode portion 11 fluctuates, a potential difference between the buried electrode portion 11 and the gate electrode portion 21 is applied to the second insulating portion 11b between the buried electrode portion 11 and the gate electrode portion 21. If the potential difference is excessively large, there is a possibility that dielectric breakdown of the second insulating portion 11b may occur and the semiconductor device 150 may be damaged. By providing the zener diode 50, the likelihood of the semiconductor device 150 being damaged by the potential difference between the buried electrode portion 11 and the gate electrode portion 21 can be reduced.

The zener diode 50 is electrically connected between the second conductive part 20 and at least a portion of the first conductive part 10. In the example of FIG. 21, the zener diode 50 is electrically connected between the second conductive part 20 and a portion of the first conductive part 10 and is connected in parallel with another portion of the first conductive part 10. When a larger voltage is applied to one of the first conductive part 10 or the second conductive part 20, the zener diode 50 causes a current to flow from the one to the other of the first conductive part 10 or the second conductive part 20.

More specifically, when the zener diode 50 is provided, the first conductive part 10 includes electrical resistances Rfp1 and Rfp2 as illustrated in FIG. 21. The second conductive part 20 is made of the electrical resistance Rg. One end of the zener diode 50 is electrically connected between the resistances Rfp1 and Rfp2. The other end of the zener diode 50 is electrically connected to the resistance Rg. The zener diode 50 is connected in parallel with the resistance Rfp1.

In the semiconductor device 150, the resistance Rfp1 is greater than the resistance Rg. The resistance Rfp1 is greater than the resistance Rfp2. Thereby, the difference between the electrical resistance of the first conductive part 10 and the electrical resistance of the second conductive part 20 can be large, and the power loss when switching can be reduced.

For example, as illustrated in FIG. 23, the wiring resistance 13 and the zener diode 50 are connected in parallel between the first wiring portion 12 and the wiring portion 33a. As illustrated in FIGS. 24A and 24B, the zener diode 50 includes multiple n-type semiconductor layers 51 and multiple p-type semiconductor layers 52 that are alternately provided. As illustrated in FIG. 24A, the zener diode 50 may be provided on the semiconductor layer SL with an insulating layer 50a interposed. Or, as illustrated in FIG. 24B, the zener diode 50 may be provided in the semiconductor layer SL with an insulating layer 50b interposed.

The modifications described above can be combined as appropriate. For example, the resistor 40 of the semiconductor device 140 or the zener diode 50 of the semiconductor device 150 may be provided in one of the semiconductor devices 110 to 130. The first conductive part 10 may include the wiring resistance 13 in one of the semiconductor devices 110, 120, or 140.

Second Embodiment

Figure 25:
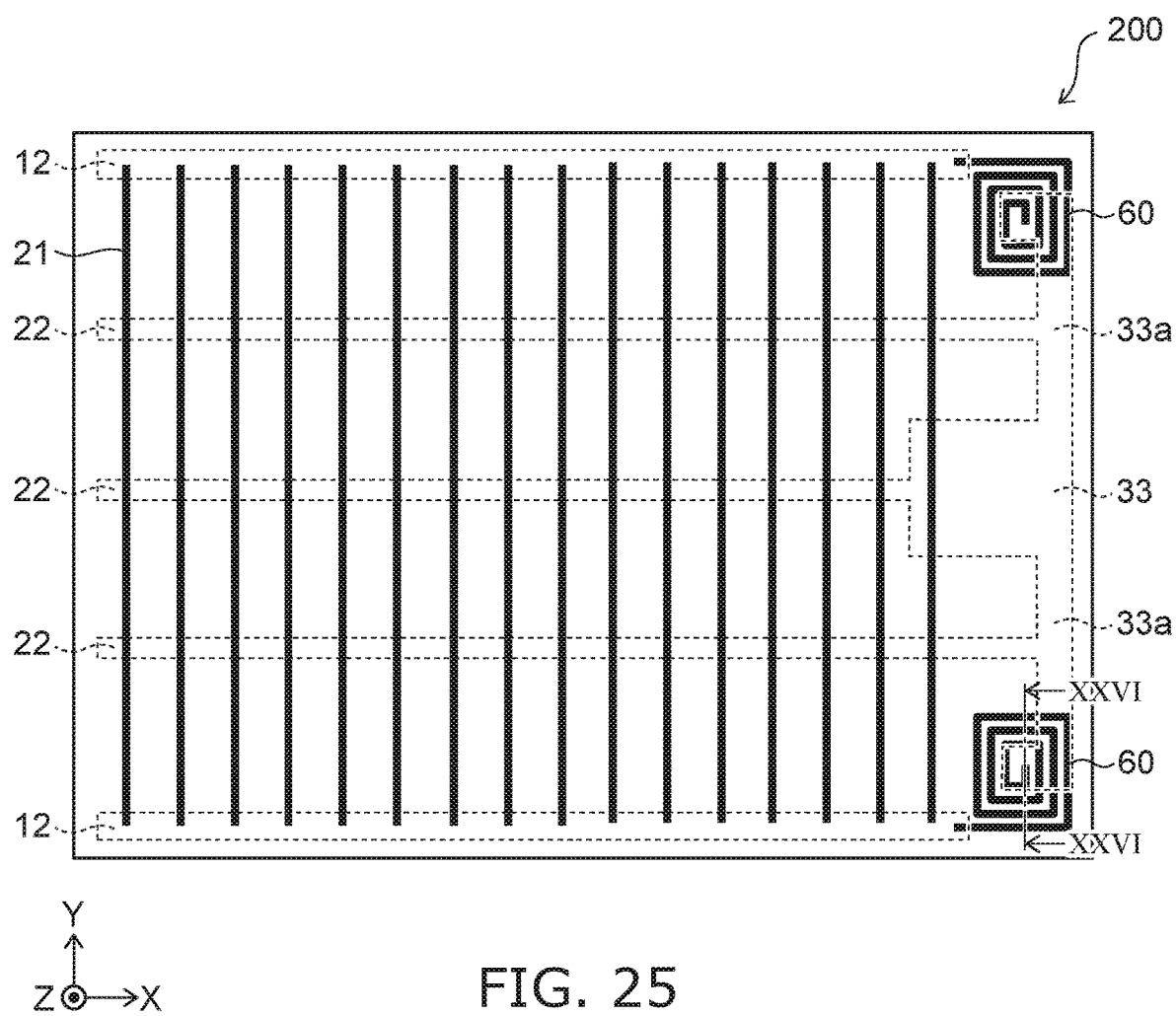
FIG. 25 is a plan view illustrating a semiconductor device according to a second embodiment.
Figure 26:
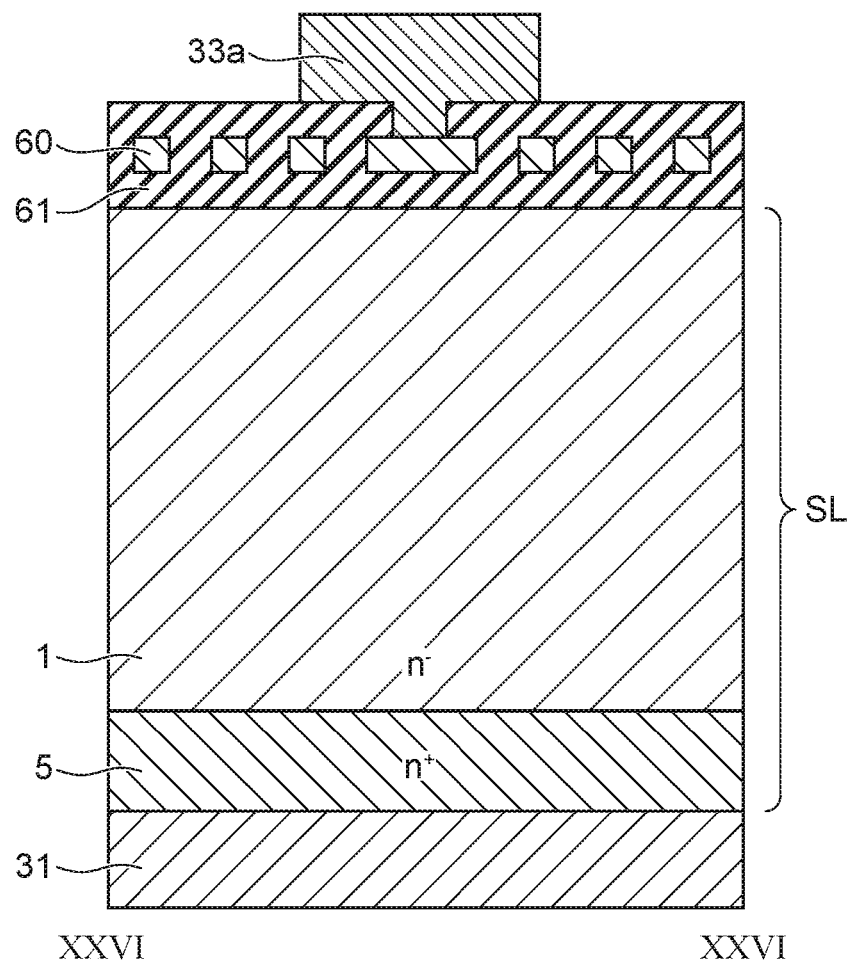
FIG. 26 is a XXVI-XXVI cross-sectional view of FIG. 25.

FIG. 25 is a plan view illustrating a semiconductor device according to a second embodiment. FIG. 26 is a XXVI-XXVI cross-sectional view of FIG. 25.

The first wiring portion 12, the second wiring portion 22, the gate pad 33, and the wiring portion 33a are illustrated by broken lines in FIG. 25. The source electrode 32 is not illustrated.

As illustrated in FIGS. 25 and 26, the semiconductor device 200 according to the second embodiment differs from the semiconductor device according to the first embodiment in that the first conductive part 10 includes a coil 60.

The coil 60 is electrically connected between the buried electrode portion 11 and the gate pad 33. The coil 60 is connected in series with the buried electrode portion 11. In the example illustrated in FIG. 25, the wiring portion 33a that extends in the Y-direction is electrically connected to the gate pad 33. The coil 60 is electrically connected between the first wiring portion 12 and the wiring portion 33a.

As illustrated in FIG. 26, the coil 60 is provided in a spiral configuration along the X-Y plane in an insulating layer 61 provided on the semiconductor layer SL. The first wiring portion 12 and the wiring portion 33a are provided on the insulating layer 61. One end of the coil 60 is electrically connected to the wiring portion 33a. The other end of the coil 60 is electrically connected to the first wiring portion 12, For example, the buried electrode portion 11 or the gate electrode portion 21 is not provided under the coil 60.

The coil 60 has a large inductance compared to the buried electrode portion 11, the first wiring portion 12, the gate electrode portion 21, the second wiring portion 22, etc. Therefore, the inductance of the first conductive part 10 is greater than the inductance of the second conductive part 20.

For example, when the capacitance Cfp is 2000 pF and the resistance Rfp is 1Ω, the inductance of the coil 60 is greater than 10 nanohenries and less than 1 microhenries. For example, the impedance is measured using an LCR meter by causing terminals to contact the one end and the other end of the coil 60. The inductance can be calculated from the measurement result of the imaginary part of the impedance.

The coil 60 includes, for example, a metal such as aluminum, copper, etc. The insulating layer 61 includes an insulating material such as silicon oxide, etc.

Figure 27:
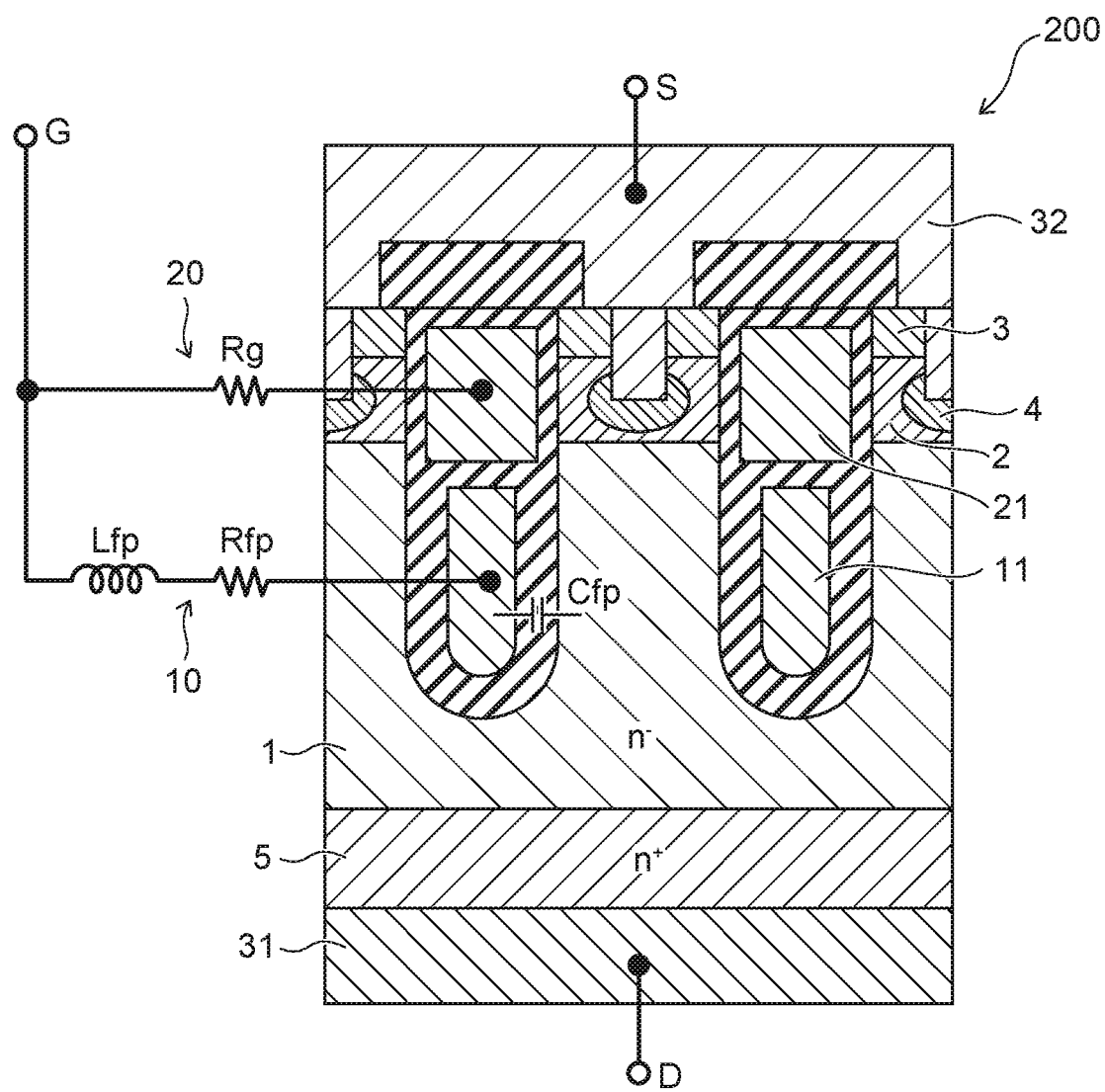
FIG. 27 is a schematic view illustrating the semiconductor device according to the second embodiment.

FIG. 27 is a schematic view illustrating the semiconductor device according to the second embodiment.

As illustrated in FIG. 27, the first conductive part 10 includes an inductance Lfp connected in series with the resistance Rfp. The inductance Lfp is the inductance of the coil 60. The resistance Rfp may be equal to the resistance Rg of the second conductive part 20 or may be different from the resistance Rg.

Figure 28:
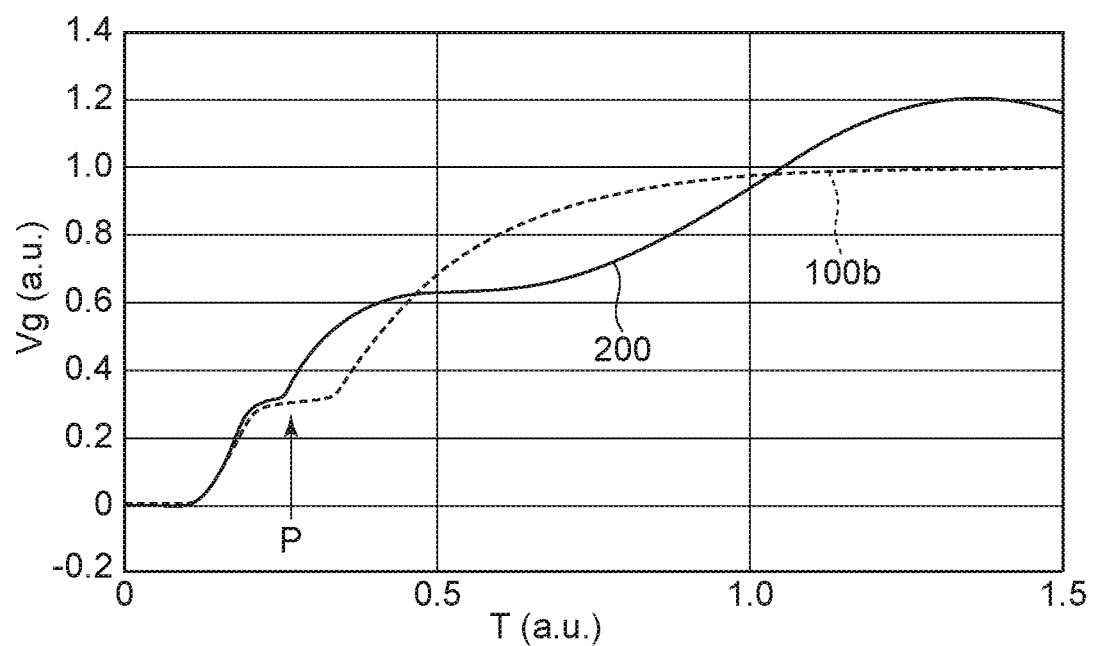
FIG. 28 is a graph illustrating characteristics of the reference example and the semiconductor device according to the second embodiment.

FIG. 28 is a graph illustrating characteristics of the reference example and the semiconductor device according to the second embodiment.

In FIG. 28, the horizontal axis is the time T. The vertical axis is the voltage Vg. The time T and the voltage Vg have arbitrary units. FIG. 28 illustrates simulation results of the change of the voltage of the gate electrode portion 21 when a voltage is applied to the gate pad 33. The characteristic of the semiconductor device 100b shown in FIG. 5 is shown as the reference example. In the semiconductor device 200, the resistance Rfp is set to be less than the resistance Rg.

It can be seen from FIG. 28 that the Miller period P of the semiconductor device 200 is less than the Miller period P of the semiconductor device 100b. In other words, according to the second embodiment, similarly to the first embodiment, the change of the voltage of the buried electrode portion 11 is delayed from the change of the voltage of the gate electrode portion 21 when the voltage of the gate pad 33 with respect to the drain electrode 31 changes. As a result, compared to the semiconductor device according to the reference example, the Miller period P can be reduced.

As illustrated in FIG. 27, the capacitance Cfp that forms between the buried electrode portion 11 and the n⁻-type drift region 1 exists between the drain electrode 31 and the first conductive part 10. When the capacitance Cfp exists in series with the resistance Rfp and the inductance Lfp, an RLC resonant circuit is formed of the resistance Rfp, the inductance Lfp, and the capacitance Cfp. Thereby, as illustrated in FIG. 28, an oscillation may occur in the voltage of the gate pad 33 when switching the semiconductor device 200.

It is favorable for the oscillation period of the voltage of the gate pad 33 to be short. When oscillating, the increase and decrease of the voltage of the gate pad 33 are repeated. When the voltage of the gate pad 33 temporarily decreases due to the oscillation, the electrical resistance of the accumulation layer formed by the buried electrode portion 11 and the electrical resistance of the inversion layer formed by the gate electrode portion 21 increase. By reducing the oscillation, the period in which the electrical resistance of the accumulation layer and the electrical resistance of the inversion layer increase can be reduced.

An oscillation period To of the voltage of the gate pad 33 is represented by the following Formula 4.

$$To = 2\pi\sqrt{Lfp \cdot Cfp} \qquad \text{[Formula 4]}$$

The Q factor that relates to the oscillation of the voltage of the gate pad 33 is represented by the following Formula 5.

$$Q = \frac{1}{R_{fp}}\sqrt{\frac{Lfp}{Cfp}} \qquad \text{[Formula 5]}$$

It is favorable for the oscillation period of the voltage of the gate pad 33 to be less than a turn-on time Ton of the semiconductor device 200. If Ton>QTo, the oscillation of the voltage of the gate pad 33 can be attenuated within the turn-on time Ton. In other words, it is sufficient for the following Formula 6 to be satisfied.

$$Ton > \frac{2\pi Lfp}{R_{fp}} \qquad \text{[Formula 6]}$$

For example, a general MOSFET is used at a frequency that is greater than 100 kHz and less than 200 kHz. In other words, one turn-on time of a general MOSFET is greater than 2.5 μseconds and less than 5.0 μseconds. It is favorable for 2πLfp/Rfp to be less than 2.5×10⁻⁶. In other words, it is favorable for the inductance Lfp to be less than 0.4×10⁻⁶ times the resistance Rfp.

First Modification

Figure 29:
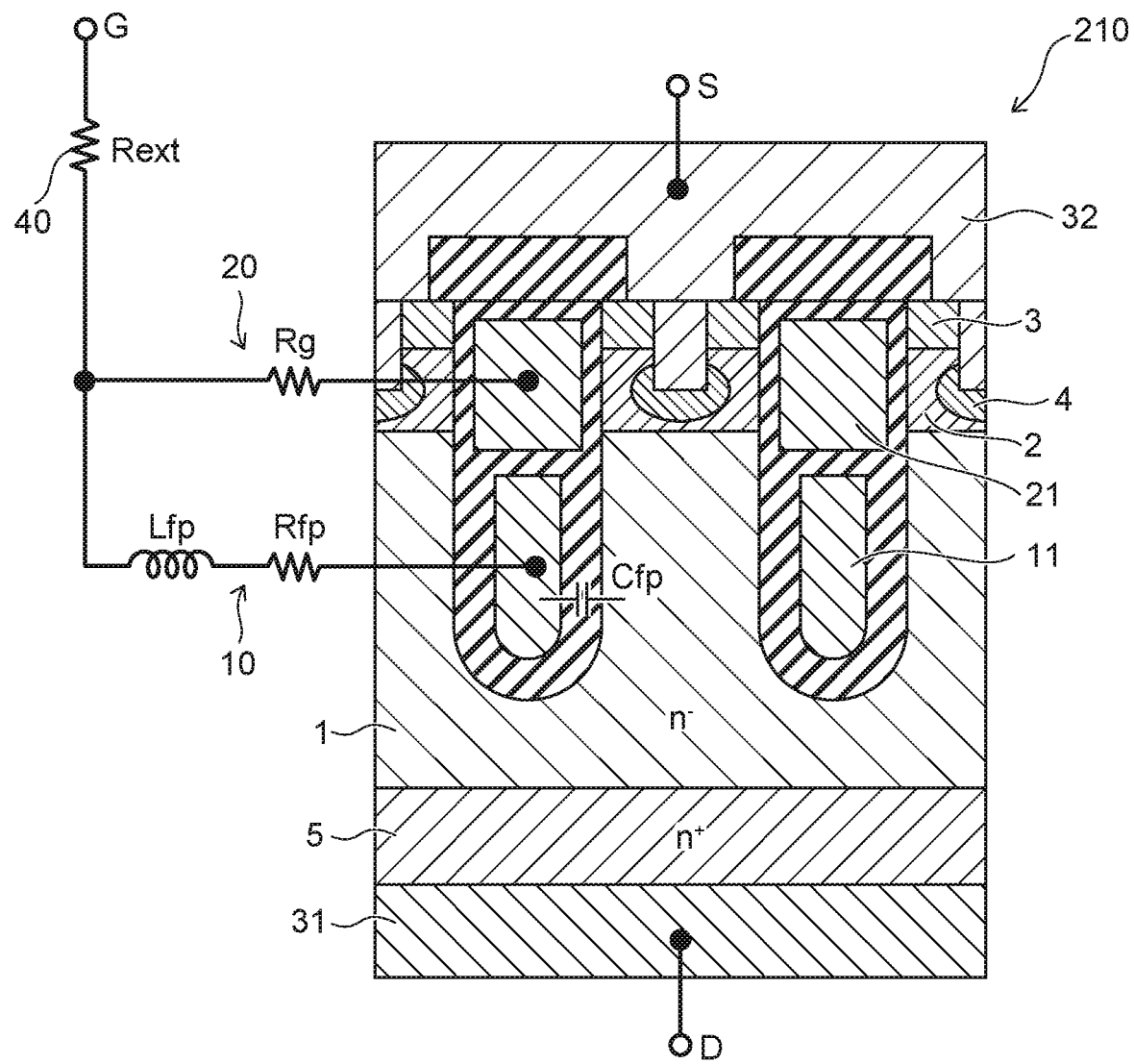
FIG. 29 is a schematic view illustrating a semiconductor device according to a first modification of the second embodiment.

FIG. 29 is a schematic view illustrating a semiconductor device according to a first modification of the second embodiment.

As illustrated in FIG. 29, compared to the semiconductor device 200, the semiconductor device 210 according to the first modification further includes the resistor 40.

The gate pad 33 is electrically connected between the first conductive part 10 and the resistor 40 and between the second conductive part 20 and the resistor 40. The electrical resistance Rext of the resistor 40 is, for example, greater than the electrical resistance Rg of the second conductive part 20. The electrical resistance Rfp of the first conductive part 10 may be greater or less than the resistance Rext.

By providing the resistor 40, the switching speed of the semiconductor device 210 can be adjusted.

Second Modification

Figure 30:
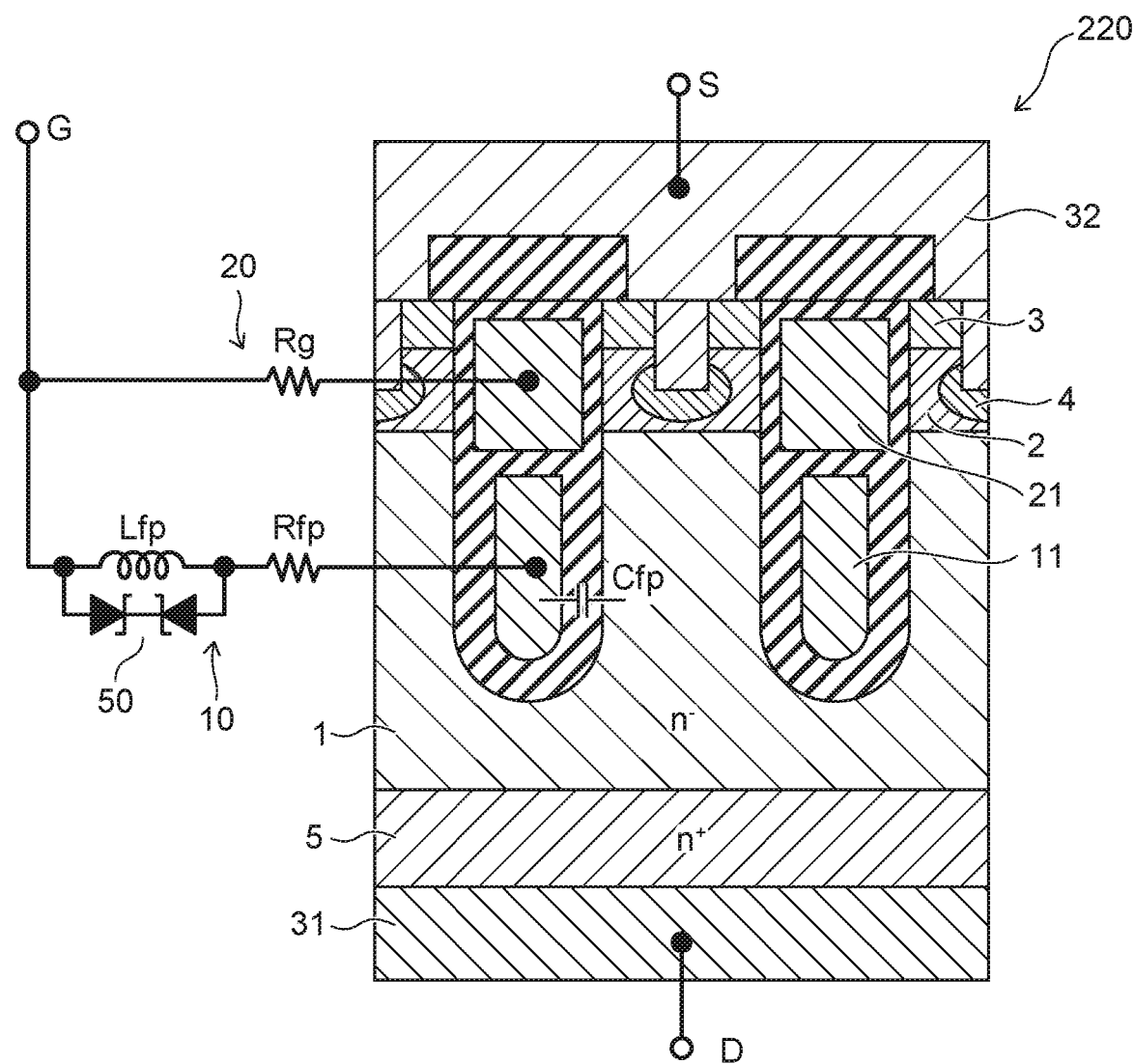
FIG. 30 is a schematic view illustrating a semiconductor device according to a second modification of the second embodiment.

FIG. 30 is a schematic view illustrating a semiconductor device according to a second modification of the second embodiment.

As illustrated in FIG. 30, compared to the semiconductor device 200, the semiconductor device 220 according to the second modification further includes the bidirectional zener diode 50.

The zener diode 50 is connected in parallel with the inductance Lfp. In other words, the zener diode 50 is connected in parallel with the coil 60. When a larger voltage is applied to one of the first conductive part 10 or the second conductive part 20, the zener diode 50 causes a current to flow from the one to the other of the first conductive part 10 or the second conductive part 20. Similarly to the fifth modification of the first embodiment, the likelihood of the semiconductor device 220 being damaged by the application of a high voltage to the first conductive part 10 and the gate pad 33 can be reduced thereby.

Third Modification

In the semiconductor device according to the second embodiment, the resistance Rfp may be greater than the resistance Rg. Compared to the semiconductor device 200, by increasing the resistance Rfp, the change of the voltage of the buried electrode portion 11 is further delayed from the change of the voltage of the gate electrode portion 21. The Miller period can be further reduced thereby. Or, by increasing the resistance Rfp, the inductance Lfp can be reduced while maintaining the reduction of the Miller period. The oscillation of the voltage of the gate pad 33 when switching can be suppressed thereby.

Figure 31A:
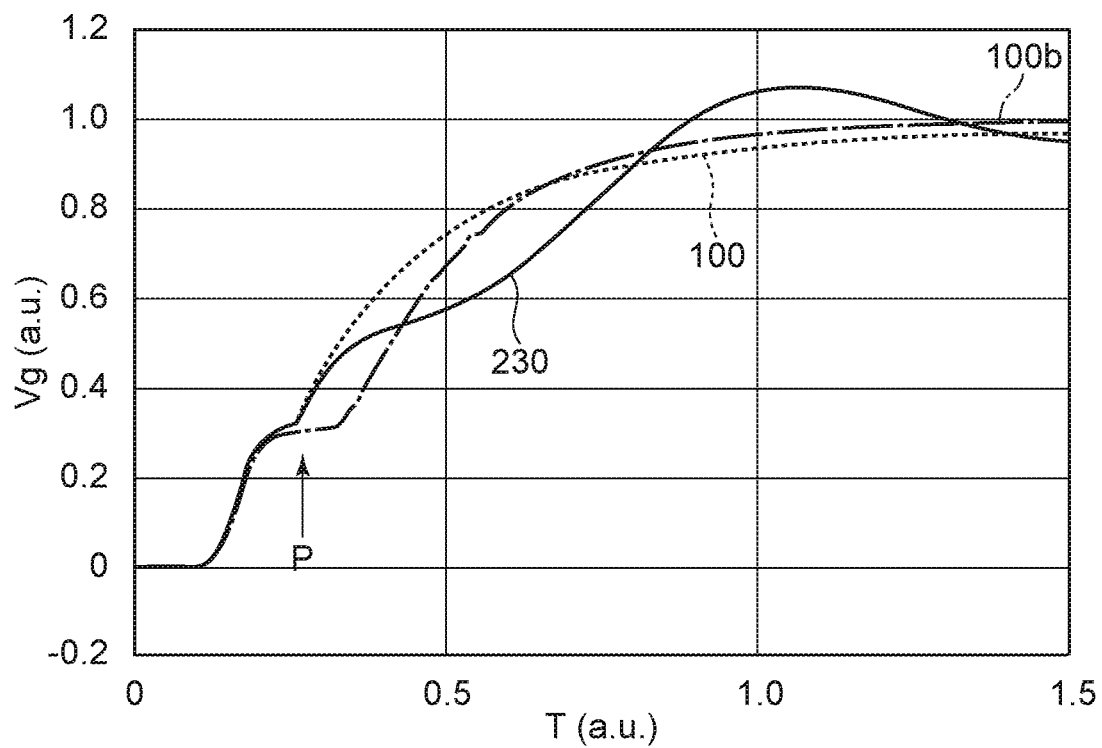
FIGS. 31A and 31B are graphs illustrating characteristics of the semiconductor devices according to the reference example, the first embodiment, and the second embodiment.
Figure 31B:
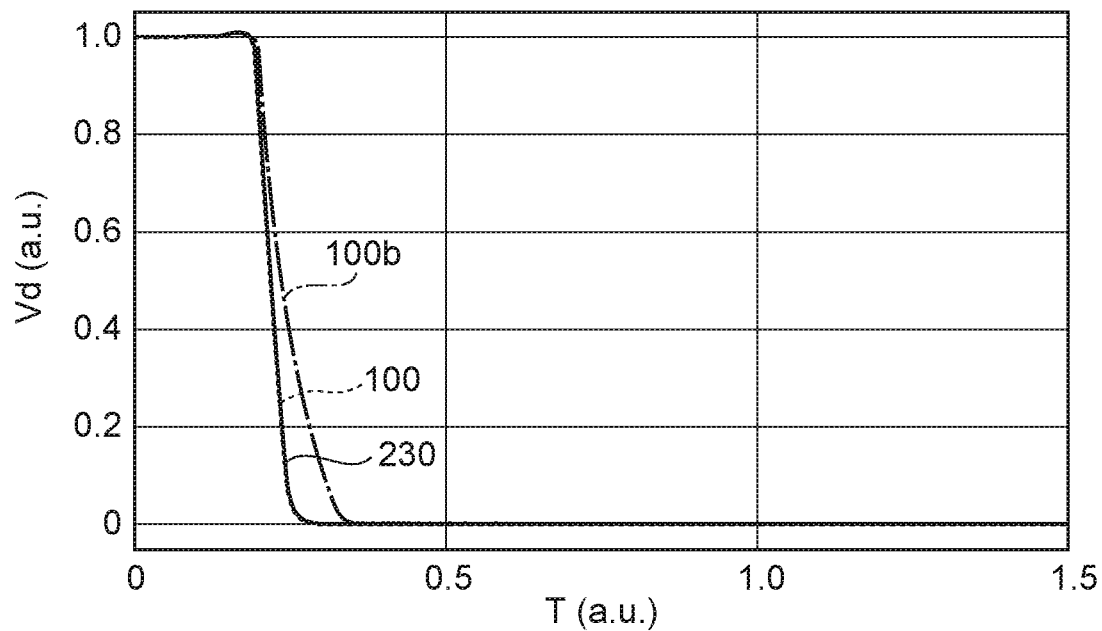

FIGS. 31A and 31B are graphs illustrating characteristics of the semiconductor devices according to the reference example, the first embodiment, and the second embodiment.

In FIGS. 31A and 31B, the horizontal axis is the time T. The vertical axis of FIG. 31A is the voltage Vg. The vertical axis of FIG. 31B is a voltage Vd of the drain electrode 31 with respect to the source electrode 32. The time T, the voltage Vg, and the voltage Vd have arbitrary units. FIGS. 31A and 31B illustrate simulation results of the changes of the voltage Vg and the voltage Vd when a voltage is applied to the gate pad 33. As the reference example, the characteristic of the semiconductor device 100b shown in FIG. 5 is shown. For the semiconductor device 100 according to the first embodiment, the characteristic when the resistance Rfp is set to 10 times the resistance Rg is shown. For the semiconductor device 230 according to the third modification, the characteristic when the resistance Rfp is set to 2 times the resistance Rg is shown.

It can be seen from the change of the voltage Vg in FIG. 31A that the Miller period P of the semiconductor device 230 is less than the Miller period P of the semiconductor device 100b and equal to the Miller period P of the semiconductor device 100. Also, from the change of the voltage Vd in FIG. 31B, the decrease of the voltage Vd in the semiconductor devices 100 and 230 is steeper than the decrease of the voltage Vd in the semiconductor device 100b. In other words, it can be seen that compared to the semiconductor device 100b, when the voltage is applied to the gate pad 33, the semiconductor devices 100 and 230 transition earlier to the on-state.

Comparing FIGS. 28 and 31A, it can be seen that the period of the oscillation of the voltage Vg in the semiconductor device 230 is less than the period of the oscillation of the voltage Vg in the semiconductor device 200. This shows that according to the third modification, the oscillation period of the voltage of the gate pad 33 in the semiconductor device 230 can be reduced compared to the semiconductor device 200.

To effectively reduce the Miller period P in the semiconductor device 230, it is favorable for the resistance Rfp to be not less than 2 times the resistance Rg. To suppress the decrease of the breakdown voltage, it is favorable for the resistance Rfp to be not more than 10 times the resistance Rg.

The modifications described above can be combined as appropriate. For example, the zener diode 50 of the semiconductor device 220 may be provided in the semiconductor device 210.

Third Embodiment

Figure 32:
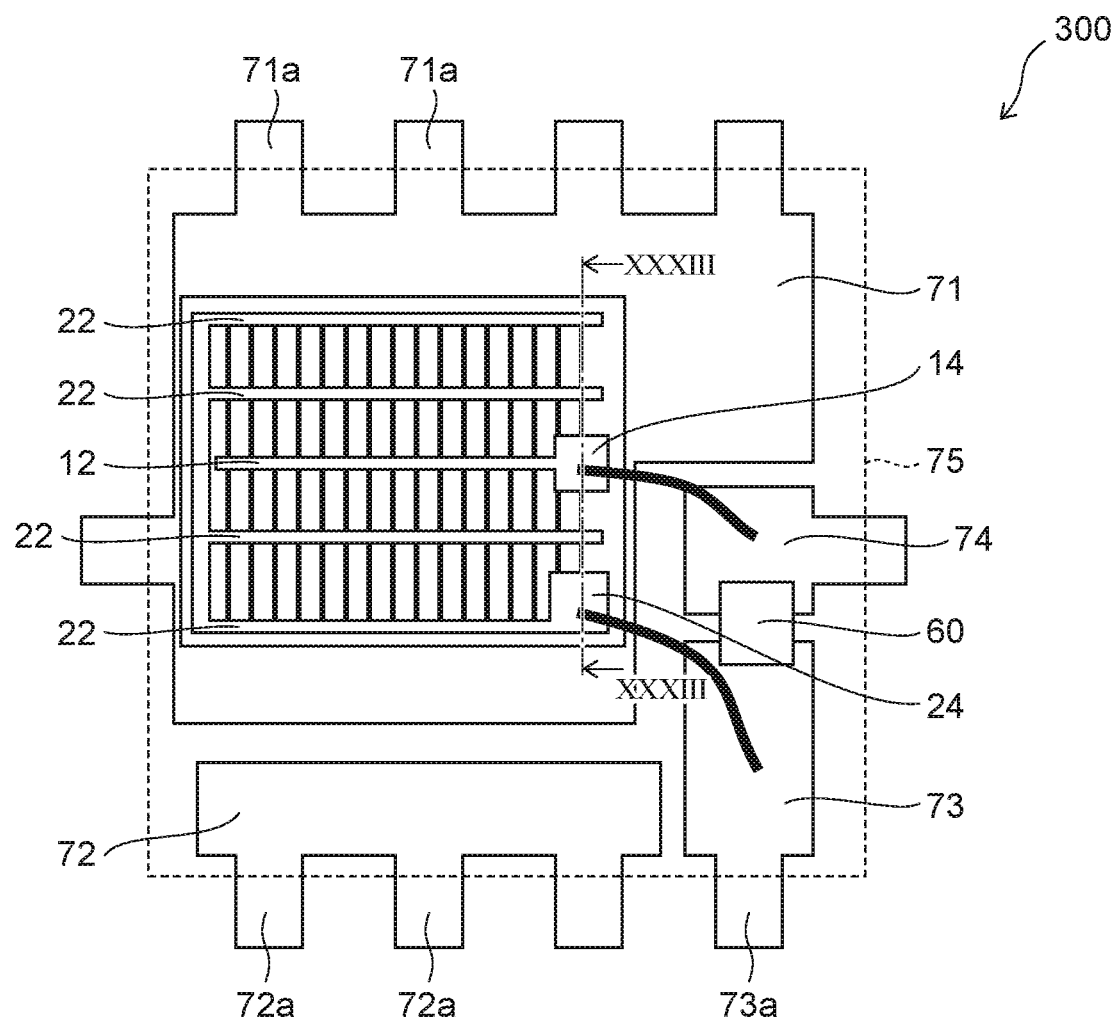
FIG. 32 is a plan view illustrating a semiconductor device according to a third embodiment.
Figure 33:
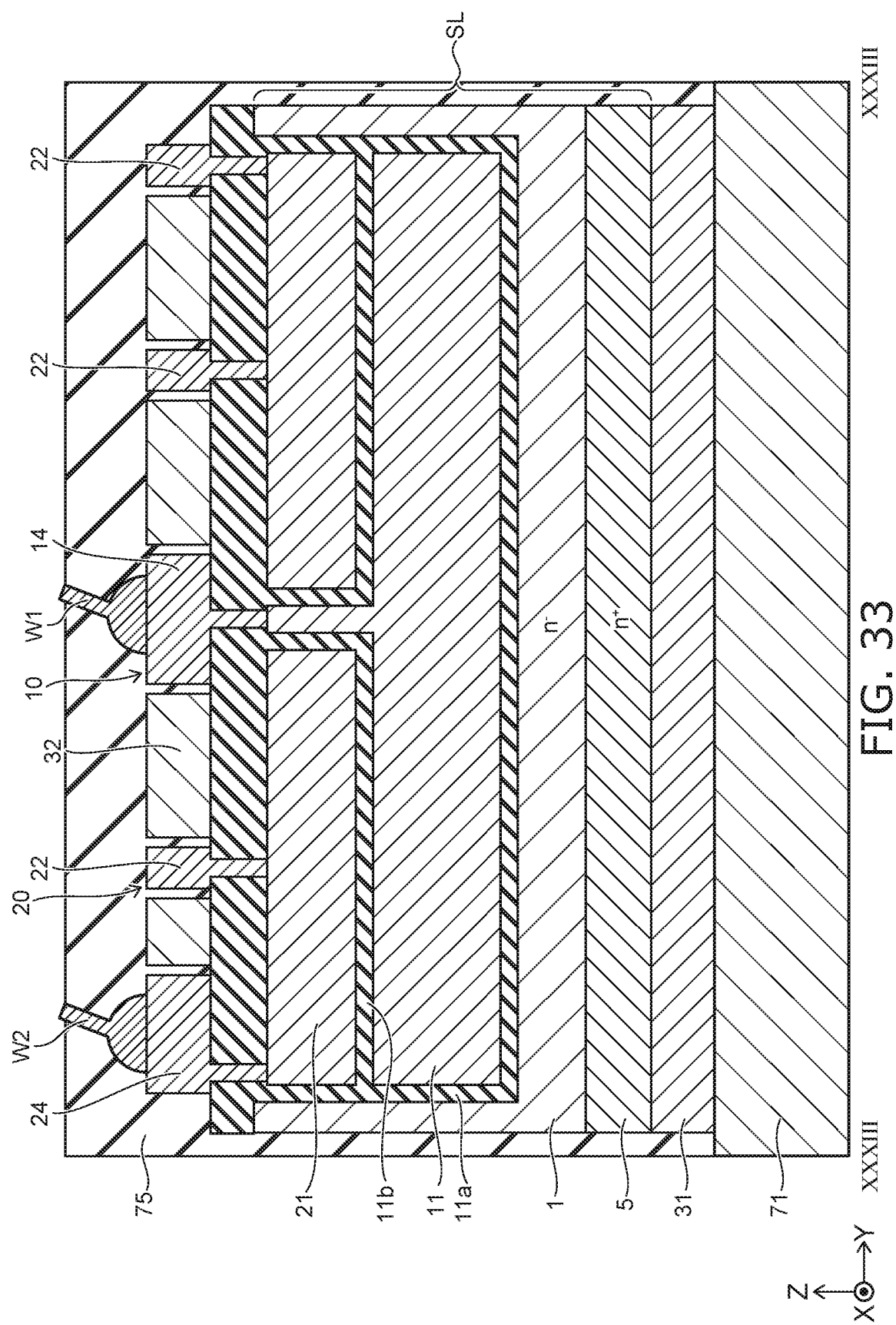
FIG. 33 is a XXXIII-XXXIII cross-sectional view of FIG. 32.

FIG. 32 is a plan view illustrating a semiconductor device according to a third embodiment. FIG. 33 is a XXXIII-XXXIII cross-sectional view of FIG. 32.

An insulating member 75 is illustrated by a broken line in FIG. 32. The source electrode 32 is not illustrated.

Compared to the semiconductor device according to the first embodiment, the semiconductor device 300 according to the third embodiment further includes the coil 60, a first metal member 71, a second metal member 72, and a third metal member 73. Also, a first pad 14 and a second pad 24 are provided instead of the gate pad 33.

The first metal member 71 is provided under the drain electrode 31. The drain electrode 31 is electrically connected to the first metal member 71. The first metal member 71 includes a first terminal 71a that protrudes in the Y-direction. Multiple first terminals 71a are provided in the X-direction.

The second metal member 72 is separated from the first metal member 71. The second metal member 72 includes a second terminal 72a that protrudes in the Y-direction. The second terminal 72a is oriented away from the first terminal 71a. Multiple second terminals 72a are provided in the X-direction.

The third metal member 73 is separated from the first and second metal members 71 and 72. The third metal member 73 includes a third terminal 73a arranged with the multiple second terminals 72a in the X-direction.

As illustrated in FIGS. 32 and 33, the first conductive part 10 includes the buried electrode portion 11, the first wiring portion 12, and the first pad 14. The first pad 14 is provided on the semiconductor layer SL. The buried electrode portion 11 and the first wiring portion 12 are electrically connected to the first pad 14. The first pad 14 is electrically connected to a metal member 74 via a bonding wire W1. The metal member 74 is separated from the first to third metal members 71 to 73.

The second conductive part 20 includes the gate electrode portion 21, the second wiring portion 22, and the second pad 24. The second pad 24 is provided on the semiconductor layer SL and separated from the first pad 14. The gate electrode portion 21 and the second wiring portion 22 are electrically connected to the second pad 24. The second pad 24 is electrically connected to the third metal member 73 via a bonding wire W2.

The metal member 74 is electrically connected to the third metal member 73 via the coil 60 that is formed into a chip. In other words, the first conductive part 10 is electrically connected to the third metal member 73 via the coil 60.

The insulating member 75 is provided on a portion of the first metal member 71, a portion of the second metal member 72, a portion of the third metal member 73, the metal member 74, and the semiconductor layer SL and seals these components.

The first metal member 71, the second metal member 72, the third metal member 73, and the metal member 74 include metals such as aluminum, copper, etc. The insulating member 75 includes an insulating resin such as polyimide, etc.

According to the third embodiment, the change of the voltage of the buried electrode portion 11 is delayed from the change of the voltage of the gate electrode portion 21 by the coil 60. Therefore, according to the third embodiment, similarly to the second embodiment, the Miller period of the semiconductor device 300 can be reduced.

The embodiments described above can be combined as appropriate. For example, similarly to the semiconductor devices according to the second or third embodiment, the coil 60 may be provided in one semiconductor device according to the first embodiment. Similarly to the semiconductor device 300, the coil 60, the first metal member 71, the second metal member 72, the third metal member 73, the metal member 74, and the insulating member 75 may be provided in one semiconductor device according to the first embodiment.

The embodiments may include the following configurations.

Configuration 1

A semiconductor device, comprising:

a first electrode;

a semiconductor layer provided on the first electrode, the semiconductor layer including a first semiconductor region electrically connected to the first electrode, the first semiconductor region being of a first conductivity type, a second semiconductor region provided on the first semiconductor region, the second semiconductor region being of a second conductivity type, and a third semiconductor region provided on the second semiconductor region, the third semiconductor region being of the first conductivity type;

a second electrode provided on the semiconductor layer and electrically connected to the second and third semiconductor regions;

a third electrode provided on the semiconductor layer;

a first conductive part electrically connected to the third electrode, the first conductive part including a buried electrode provided in the first semiconductor region with a first insulator interposed, a first wire provided on the semiconductor layer and electrically connected to the buried electrode, and a wiring resistance electrically connected between the first wire and the third electrode; and a second conductive part including a gate electrode provided on the buried electrode with a second insulator interposed, the gate electrode facing the second semiconductor region via a gate insulator, an electrical resistivity of the wiring resistance being greater than an electrical resistivity of the first wire.

Configuration 2

The semiconductor device according to Configuration 1, wherein an electrical resistivity of the buried electrode is greater than an electrical resistivity of the gate electrode.

Configuration 3

The semiconductor device according to Configuration 1 or 2, further comprising:

a zener diode electrically connected between the first conductive part and the second conductive part, the zener diode being bidirectional.

Configuration 4

The semiconductor device according to any one of Configurations 1 to 3, wherein the first conductive part further includes a coil.

Configuration 5

The semiconductor device according to any one of Configurations 1 to 3, further comprising:

a first metal member provided under the first electrode and electrically connected to the first electrode;

a second metal member separated from the first metal member and electrically connected to the second electrode; and a third metal member separated from the first and second metal members, electrically connected to the second conductive part, and electrically connected to the first conductive part via a coil.

In each of the embodiments described above, the relative levels of the impurity concentrations between the semiconductor regions can be confirmed using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. The impurity concentration in each semiconductor region can be measured by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:

a first electrode;

a semiconductor layer provided on the first electrode, the semiconductor layer including a first semiconductor region electrically connected to the first electrode, the first semiconductor region being of a first conductivity type, a second semiconductor region provided on the first semiconductor region, the second semiconductor region being of a second conductivity type, and a third semiconductor region provided on the second semiconductor region, the third semiconductor region being of the first conductivity type;

a first conductive part including a buried electrode provided in the first semiconductor region with a first insulator interposed;

a second conductive part including a gate electrode provided on the buried electrode with a second insulator interposed, the gate electrode facing the second semiconductor region via a gate insulator; and a second electrode provided on the semiconductor layer and electrically connected to the second and third semiconductor regions, the first conductive part being electrically connected to the second conductive part, an electrical resistance of the first conductive part being greater than an electrical resistance of the second conductive part.

2. The device according to claim 1, further comprising:

a third electrode provided on the semiconductor layer and electrically connected to the first and second conductive parts, the first conductive part further including a first wire provided on the semiconductor layer and electrically connected between the buried electrode and the third electrode, the second conductive part further including a second wire provided on the semiconductor layer and electrically connected between the gate electrode and the third electrode.

3. The device according to claim 2, further comprising:
a resistor,
the third electrode being electrically connected between the resistor and the first conductive part and between the resistor and the second conductive part,
the electrical resistance of the first conductive part being greater than an electrical resistance of the resistor.

4. The device according to claim 2, wherein
the first conductive part further includes a wiring resistance electrically connected between the first wire and the third electrode, and
an electrical resistivity of the wiring resistance is greater than an electrical resistivity of the first wire.

5. The device according to claim 1, wherein
the electrical resistance of the first conductive part is not less than 10 times and not more than 300 times the electrical resistance of the second conductive part.

6. The device according to claim 1, further comprising:
a zener diode electrically connected between the first conductive part and the second conductive part,
the zener diode being bidirectional.

7. The device according to claim 1, wherein
the first conductive part further includes a coil.

8. The device according to claim 1, further comprising:
a first metal member provided under the first electrode and electrically connected to the first electrode;
a second metal member separated from the first metal member and electrically connected to the second electrode; and
a third metal member separated from the first and second metal members, electrically connected to the second conductive part, and electrically connected to the first conductive part via a coil.

* * * * *